United States Patent [19]

Skerlos

[11] 4,279,035
[45] Jul. 14, 1981

[54] CHANNEL NUMBER ENTRY SYSTEM

[75] Inventor: Peter C. Skerlos, Arlington Heights, Ill.

[73] Assignee: Zenith Radio Corporation, Glenview, Ill.

[21] Appl. No.: 107,805

[22] Filed: Dec. 27, 1979

[51] Int. Cl.³ .......................... H04B 1/16; H04N 5/50
[52] U.S. Cl. ..................................... 455/158; 455/184; 455/186; 455/194; 358/192.1
[58] Field of Search ................ 455/158, 166, 184–186, 455/168, 180, 194; 358/191.1, 192.1

[56] References Cited

U.S. PATENT DOCUMENTS

| | | | |
|---|---|---|---|
| 3,931,579 | 1/1976 | Ma et al. | 455/184 |
| 3,962,644 | 6/1976 | Baker | 455/168 |
| 3,973,228 | 8/1976 | Mueller et al. | 455/158 |
| 3,980,958 | 9/1976 | Tanaka | 455/184 |
| 4,093,922 | 6/1978 | Buss | 455/186 |
| 4,151,559 | 4/1979 | Merrell | 358/192.1 |
| 4,162,513 | 7/1979 | Beyers, Jr. et al. | 455/186 |

OTHER PUBLICATIONS

"A Microcomputer Controlled Frequency Synthesizer for TV" by Rzeszewski et al., 2/1978.
"A Low Cost Varactor Tuning System for TV" by Borg, IEEE Transaction on Consumer Electronics, vol. CE-24, No. 1, 2/78.
"A Systems Approach to Low Cost Electronic Tuning Address" by Howell et al. IEEE Transaction on Consumer Electronics, vol. CE-24, No. 3, 8/78.
"Farbfernsehgerat mit Mikroprozessor–Steurung" by Baum, 8/12/1977, Funkschau, HEFT 17.

Primary Examiner—Jin F. Ng
Attorney, Agent, or Firm—Thomas E. Hill

[57] ABSTRACT

A keyboard-operated, microcomputer-controlled method and apparatus for selecting a channel in a television receiver. Following selection of the desired channel, appropriate tuning data is stored in memory with the channel number display updated to present the selected channel until a second entry is made whereupon the selected channel tuning data is read from memory and transmitted to tuning circuitry. If a second entry is not made within a predetermined time interval from channel number entry, the system remains tuned to the previously selected channel with the channel number display reverting to the previously selected channel number. If an illegal channel number is selected, the system remains tuned to the previously selected valid channel number which is once again displayed when the second entry is made or after a predetermined time interval from channel number entry if no second entry is made.

11 Claims, 5 Drawing Figures

CHANNEL NUMBER ENTRY SYSTEM

CROSS REFERENCE TO RELATED APPLICATIONS

This application is related to the following applications all of which are assigned to the assignee of the present application: Ser. No. 107,732, filed Feb. 19, 1980, entitled "Microcomputer-Controlled One Back Step Automatic Frequency Control Tuning System" in the name of Peter C. Skerlos; Ser. No. 157,573, filed June 9, 1980, entitled "Multi-Mode Automatic Channel Frequency Synthesis System", in the name of Peter C. Skerlos; and Ser. No. 164,716 filed June 30, 1980, entitled "Automatic Fine Tuning with Wide Band Automatic Frequency Control", in the name Akio Tanaka.

BACKGROUND OF THE INVENTION

This invention relates generally to television channel selection, and more particularly relates to the keyboard selection of a television channel and the microcomputer-controlled display of and tuning to the selected channel number.

Television receivers are generally tuned by rotating a tuning knob to sweep the broadcast frequency band which has been preselected by means of a frequency band switch. The currently tuned channel indication is provided by the channel number indicator which moves along a scale. This type of television tuning system utilizes mechanical and electromechanical components and is characteristically slow in response, noisy, subject to mechanical breakdown and best suited for use with a limited number of channels. The proliferation of UHF channels and the increasing use of CATV and MATV have rendered these electromechanical tuning systems of limited utility in current television receivers. The all-electronic, all-channel tuning system has thus been developed to meet current television tuning system demands. Electronic tuning systems are characterized by silent operation, high speed, all-channel tuning and solid state electronics reliability. In these systems, channel selection is typically by means of a 10-digit, push button keyboard entry with channels accessed either substantially in a stepwise manner or by direct channel tuning. While these digital electronic tuning systems permit extremely rapid channel selection, no allowance is made for user entries which are erroneous in terms of the channel desired and that which was actually selected or which involve the entry of an illegal (non-FCC designated) channel number.

The prior art includes several approaches to optimizing the user-tuner interface by reducing the possibility of erroneous tuner inputs and ameliorating the resulting inconvenience. U.S. Pat. Nos. 3,931,579 to Ma et al and 3,980,958 to Tanaka illustrate one approach for compensating for an illegal channel number entry wherein signal recognition means cause the channel number selection means to sequence to another number if no television signal is received. This technique utilizes a comparator to compare the information from the channel number selection means with the information from a local oscillator to determine the presence of an acceptable signal within a restricted range about the frequency corresponding to the designated channel number. The comparator is coupled to a ramp voltage source for controlling both the tuning voltage direction and rate of change in making corrections to the local oscillator frequency in tuning to the desired channel. After a predetermined delay, information from the comparator is analyzed for coincidence with a signal from the recognition means in a channel selection control and if signal coincidence is lacking the channel counter sequences to the next designated channel number. This approach thus permits an illegal channel number and any unused channel to be quickly bypassed in a sequential fashion but does not allow for either user verification of the selected channel number prior to channel switching following channel number entry or return to the previously tuned channel following an erroneous or illegal channel number entry.

Another approach is disclosed in U.S. Pat. No. 3,973,228 to Mueller et al involving the automatic sequential stepping from channel to channel at a first relatively slow rate for preselected channels to which the receiver is to respond and for skipping over other non-selected channels at a relatively high frequency. This permits the rapid detection and rejection of a selected illegal channel but also involves the inconvenience of sequencing through all channels intermediate between an illegal channel and the original channel to obtain the channel which was originally tuned in. In addition, the erroneous selection of a legal channel also necessitates the sequential stepping through of intermediate channels before regaining the original channel.

Still another approach to the problem of erroneous channel selection is disclosed in U.S. Pat. No. 4,162,513. The microcomputer-controlled electronic tuning system as described therein provides for the entry of an illegal channel number by causing the tuner not to respond to such an entry and the channel number display to remain unchanged. However, this procedure is complicated by the fact that some illegal channel numbers are used to select various modes of selector operation, e.g., illegal channel number 00 is used to turn the receiver off, and because the device itself is designed primarily as a channel programmer for automatically tuning in a selected channel at a future predetermined time. In addition, this system fails to provide for the temporary display of the erroneously selected channel number to permit user correction of an erroneous entry prior to receiver tuning to the unwanted channel. A more remotely related channel number entry approach involving the use of a microcomputer is disclosed in "A Microcomputer Controlled Frequency Synthesizer for TV," IEEE Transactions on Consumer Electronics, Vol. CE-24, No. 2, May 1978, by Rzeszewski et al.

In accordance with the present invention, the aforementioned channel selection problems are eliminated by means of a two-step channel selection process—channel number entry followed by a second entry withn a predetermined time period.

OBJECTS OF THE INVENTION

Accordingly, it is an object of the present invention to provide a novel method and apparatus for the keyboard selection of a channel in a television receiver.

It is another object of the present invention to provide a microcomputer controlled method and apparatus for substantially reducing the possibility of mistakenly tuning to an unwanted television channel following an erroneous channel number entry.

It is another object of the present invention to permit retention of the presently tuned channel in the event an erroneous channel number entry is made.

Still another object of the present invention is to provide a television channel selection method and apparatus by which the television receiver remains tuned to and displays the number of the previously selected channel if an illegal channel number is selected.

It is still another object of the present invention to provide a two-step channel selection process in which the possibility of tuning to an erroneously selected channel is minimized.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
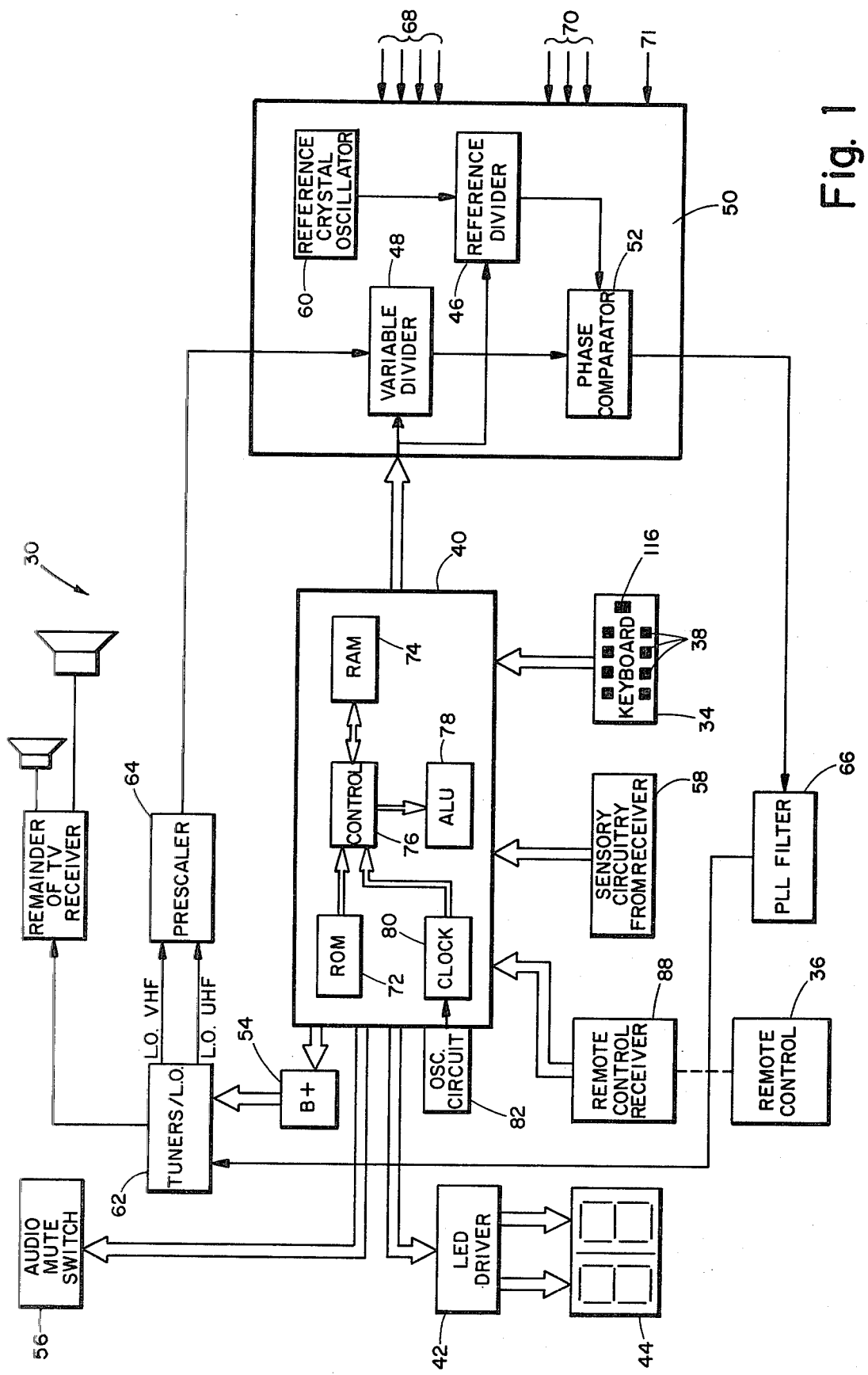
FIG. 1 is a generalized block diagram of a television tuning system incorporating the channel number entry system in accordance with the present invention.

Referring to the block diagram of FIG. 1, an indirect frequency synthesis microcomputer-controlled television tuning system 30 incorporating a channel number entry system 32 in accordance with the present invention is shown. Channel selection is made by keyboard 34 or by remote control 36 entry. Touch pads 38 on the front panel of the keyboard 34 and on the remote controller 36 provide direct entry of the channel number digits to the microcomputer 40. When the desired channel number is entered the following events occur: (1) a microcomputer output signal to the LED drive/decoder 42 activates the proper segments of the seven segment LED display 44 in displaying the channel number selected; (2) the microcomputer 40 loads the correct divide ratio for the selected channel into the reference divider 46 and the variable divider 48 of the phase lock loop (PLL) 50 which alters the input frequencies to the phase comparator 52; (3) the microcomputer 40 determines whether the channel selected is LOW VHF, HIGH VHF, or UHF and applies the proper output to the U/V B+ switch and the VHF high/low band switch 54; and (4) the microcomputer 40 activates the audio mute switch 56. The audio mute switch 56 mutes the audio output during channel switching to provide silent channel switching for user comfort. The sensory circuits 58 receive several inputs such as system clocking information, vertical synchronization data, "enter" key selection information, and AFC tuning voltage information from which the microcomputer 40 provides edge and window tuning information to the phase lock loop 50.

Indirect frequency synthesis is accomplished by means of the phase lock loop 50 as controlled by the microcomputer 40. In the PLL 50, a reference crystal oscillator 60 frequency is divided by a twelve stage divider network, the reference divider or counter 46, to provide a divided down signal to the phase comparator 52. The reference divider 46 includes four fixed and eight programmable divider stages. Similarly, the output of a tuner local oscillator 62 is divided by a fixed prescaler 64 in providing an input signal at a divided down frequency to the PLL chip 50. Additional frequency division of this signal is accomplished on the PLL chip 50 by means of a twelve stage divider with two fixed stages and ten programmable stages, the output from which is transmitted to the phase comparator 52. When the frequencies of the output signals from the variable counter 48 and the reference counter 46 to the phase comparator 52 are exactly equal, the comparator output is zero. When there is any difference between these two frequencies, the phase comparator 52 will develop an output which, when passed through the PLL filter 66, provides a correction voltage to the tuner local oscillator 62 to change the local oscillator frequency until the two signals have exactly the same frequency. The local oscillator 62 then assumes the stability of crystal reference oscillator 60. This frequency comparison is done continually in order to compensate for tuner oscillator drift.

In order for the phase comparator 52 to operate correctly the divided down local oscillator frequency should always be about equal to the other comparator input from the reference crystal oscillator 60 of about 1 KHz. Since the oscillator frequencies are different for each channel, a different divide ratio must be used for each selected channel in programming the reference divider 46 and the variable divider 48. Programming of these dividers is accomplished by the microcomputer 40 which establishes the correct divide ratio for tuning to the selected channel. Four inputs from the microcomputer 40 to the PLL 50 are data lines 68 which transmit serial data from the microcomputer 40 to the PLL 50 for controlling the various dividers. Three data steering lines 70 are also input to the PLL chip 50 for addressing the appropriate latch (not shown) in the PLL. The eighth input from the microcomputer 40 to the PLL 50 is an "ENABLE" line 71 which transmits a load data command to permit the PLL to receive only correct data and to exclude other information which may be present on the data line at various times. The output of the phase comparator 52 is a series of pulses the duty cycle of which is a function of the difference between the reference frequency of 1 KHz and the divided down local oscillator frequency. These pulses are filtered by the active PLL filter 66 resulting in a DC voltage with a negligible amount of 1 KHz ripple delivered to the local oscillator 62.

Input pulses to the PLL filter 66 occur in the steady state due to leakage and drift in the PLL system. Negative-going pulses with respect to the tuner system's quiescent DC level occur when the system transitions from a lower oscillator frequency to a higher oscillator frequency. Positive-going pulses occur for changes from higher to lower frequencies or to compensate for leakage or drift conditions in tuner circuitry.

Binary signals generated by the keyboard 34 are transmitted to the microcomputer 40. The microcomputer 40 is a four bit, E/D MOS integrated circuit with a ROM 72, a RAM 74, and a controller 76. The microcomputer stores instructions and data, periodically updates the stored data, compares both stored and real-time data and makes decisions based upon these comparisons by means of logic instructions in providing system control. The ROM 72 is mask-generated, non-volatile, factory produced 768×8 bit memory matrix which includes 1,024 memory locations or "bytes" of 8 bits each. Program instructions and data are stored in the ROM 72 which has a 75 instruction capacity. Hexadecimal notation is used by the ROM from which instructions and data are sequentially removed by the microcomputer controller 76 in carrying out program functions. The RAM 74 has a X-register, Y-register memory matrix organization for temporary memory storage of 32 words of four bits each. Each bit may be used as a flag to indicate whether a particular event has occurred or the individual flags can be used in combination in the form of a counter. The memory storage organization of the RAM 74 can best be illustrated by referring to Table 1, wherein is shown half of the RAM map.

Memory locations are designated by M(X,Y) terminology with words expressed generally in hexadecimal code. For example, the received channel designation would be located in the M(0,5) location (units) and the M(0,4) location (tens). Similarly, the display channel numbers would be stored in memory locations M(0,3) (units) and M(0,2) (tens). When channel numbers are selected by means of the keyboard 34 they are immediately stored in RAM memory locations M(0,3) and M(0,2).

channel number entry, however, the contents of memory locations M(0,5) and M(0,4) is transferred to memory locations M(0,3) and M(0,2) with the result that the tuner does not tune to a new channel and the channel number display reverts to the number of the presently tuned channel. Information stored in the RAM 74, which is a volatile memory, is lost when the receiver is turned off. However, information stored in the ROM 72 is not lost either when the receiver is turned off or when power is removed from the receiver. When the television receiver is again turned on, the microcomputer program initializes the RAM data from the ROM 72 which causes the binary signals representing the first instruction stored in the ROM 72 to be coupled to the microcomputer controller 76 and causes various other portions of the microcomputer chip 40 to be initialized for proper future operation when power is applied to the micromputer 40. An arithemtic and logic unit (ALU) 78 receives binary control signals from the microcomputer controller 76 and performs the required arithmetic or logic operation.

Microcomputer chip timaing is provided by means of an oscillation circuit on the chip 80 which generates the clock signal necessary to perform a given operation. The clock generator 80 is driven by an oscillator circuit 82, portions of which are located internal to and external to the microcomputer chip 40. More detailed information regarding the microcomputer chip configuration and operation is contained in the Matsushita Electronics Corporation publication entitled "MN 1400 Series: 4-Bit 1-Chip Microcomputer".

TABLE 1

| V SYNC DATA | AFC TIMING COUNT | | MFT TIMER 2 | MFT TIMER 1 | PLL REFERENCE LOWER LIMIT LATCH 1 | PLL REFERENCE UPPER LIMIT LATCH 1 | PLL REFERENCE DATA LATCH 1 | 1 |
|---|---|---|---|---|---|---|---|---|
| V SYNC OK FLAG | LOW LEVEL MEMORY | AFC OK FLAG/ | NOT AFC FLAG | | NEL | KEY | KEY INPUT | |
| V SYNC NO PULSE FLAG | LOW LEVEL | COMP. 1 LOW | COUNTER | | | BOUNCE | DATA | 0 |
| HIGH LEVEL COUNTER | COUNTER | | COUNTER | | | | | |
| F | E | D | C | B | A | 9 | 8 | X/Y |
| PLL REFERENCE DATA LATCH 0 | PLL SELECTOR DATA LATCH 4 | PLL SELECTOR DATA LATCH 3 | PLL SELECTOR DATA LATCH 2 | TIMER 3 | DISPLAY TIMER | TIMER 2 (32 MSEC.) | TIMER 1 (82 MSEC.) | 1 |
| | SOUND MUTE FLAG | RECEIVING CHANNEL | RECEIVING CHANNEL | DIS- PLAY | DISPLAY | UHF SUPER-BAND | AFC TIMING ENABLE STAND BY FLAG | |
| | VIDEO | | | CHAN- | CHANNEL | MID-BAND | CATV SW | |
| | MUTE FLAG | UNITS | TENS | UNITS | TENS | HVHF | AFC SW | 0 |
| 7 | 6 | 5 | 4 | 3 | 2 | 1 | 0 | X/Y |

Figure 2:
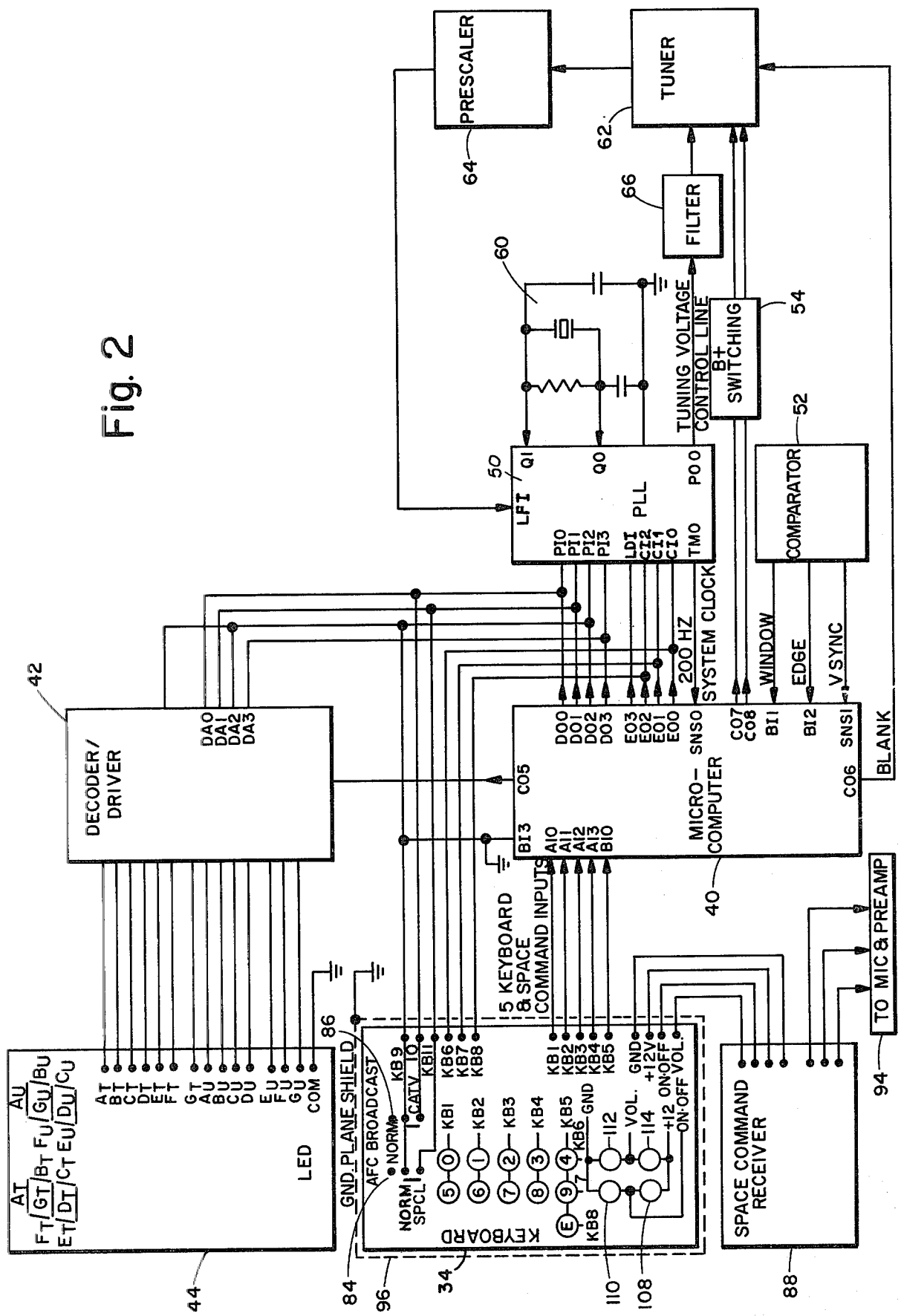
FIG. 2 is a detailed block diagram of a channel number entry system in accordance with a preferred embodiment of the present invention.

The contents of these memory locations will be transferred to memory locations M(0,5) and M(0,4) if the "Enter" control 116 is selected within 4.5 seconds from the time of channel entry. The system will thus tune to the newly selected channel numbers. If the "Enter" control 116 is not selected within 4.5 seconds of initial A more detailed block diagram of a channel number entry system in accordance with a preferred embodiment of the present invention is shown in FIG. 2. Terminals KB9 through KB11 on the keyboard 34 provide information to the microcomputer 40 by means of the microcomputer output terminals DO2 through DO0. By means of the constant scanning of the keyboard 34 by the microcomputer 40 information regarding contact key closure is transmitted from the KB9 terminal on the keyboard to the BI3 input terminal on the microcomputer. The KB9 terminal provides an output from either the AFC or the CATV switch, 84 and 86 respectively, on the keyboard 34 to the microcomputer 40. The input scanning signal from the microcomputer enters the keyboard at the KB10 input terminal which monitors the status of the CATV switch. The KB11 input terminal to the keyboard provides for the AFC switch 84 scanning signal from the microcomputer 40. The return signal from both switches is transmitted from the KB9 terminal on the keyboard 34 to the BI3 input terminal on the microcomputer 40. Digit pad scanning signals enter the keyboard via input terminals KB1 through KB8. KB6 carries the scanning signal for keys 0 through 4 while input terminal KB7 carries a signal which periodically scans keys 5 through 9 for contact closure. KB8 carries a microcomputer generated signal for scanning the "Enter" key 116. These scanning signals originate it microcomputer output terminals EO0, EO1 and EO2, respectively. The initial scanning signal from the microcomputer is transmitted to terminal KB6 and looks for input signals from terminals KB1 thru KB5, sensing contact closure for keys "0" thru "4", respectively. The next scanning signal, which is transmitted to terminal KB7, tests for contact closure of keys "5" thru "9". The third scanning signal, which is transmitted to terminal KB8, tests for the engagement of the "ENTER" key, which the microcomputer senses on terminal KB5.

Figure 3:
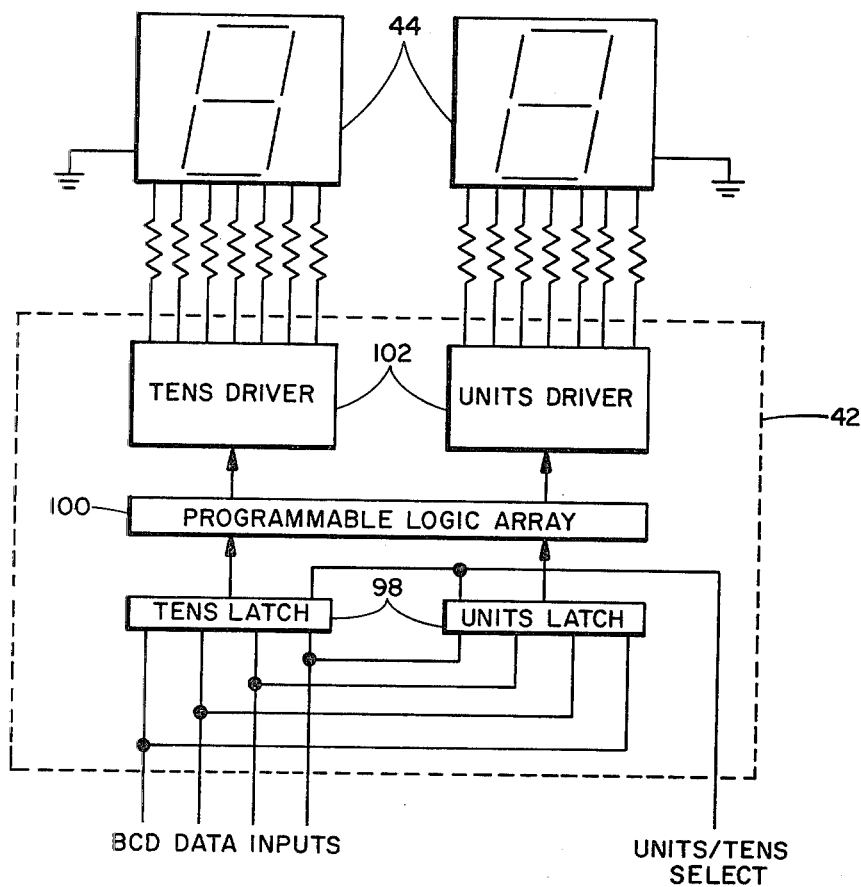
FIG. 3 shows the decoder/driver circuit for the LED channel number display.

The LED display 44 is controlled by the microcomputer 40. The LED decoder/driver circuit 42, as shown in FIG. 3, contains a latch circuit 98 which stores the BCD control signal information from the microcomputer 40 until it is updated. The four main control lines for the "units" data and the "tens" data are in parallel. The data select line, or programmable logic array 100, determines whether the information is for the tens digit or units digit. Tens digit information is loaded on the positive to negative transition of the signal on the programmable logic array 100. Units digit information is loaded on the negative to positive transition signal on the programmable logic array 100. The four bit binary code on the input lines is decoded internally by the programmable logic array 100 to seven segment information for the LED display 44. The LED display is a two-digit common cathode direct drive unit powered by the display drivers 102. When a new channel is selected by the ten-digit keyboard 34 the microcomputer 40 computes the correct number to load into the programmable or variable divider 48 based upon the new channel number. the microcomputer 40 outputs this number in groups of four bits on output pins DO0 through DO3, addresses the appropriate latches in the phase lock loop 50 by means of output pins EO0 through EO2, and loads the latches by means of output pin EO3. It also uses the same pins DO0 through DO3 to load the display drivers 102 with the correct information for display on the two seven segment LED displays 44. This information is loaded by means of a control signal output from pin CO5 which determines whether the data is to go into the units or tens display. The microcomputer 40 outputs additional control information for muting on output CO9 when there is no signal present such as during a search when the system is between stations. The four data input lines entering the decoder driver chip 42 on pins DA0 through DA3 are converted to two groups of seven outputs to drive the seven segment displays 44. The LED display 44 shown in FIG. 2 illustrates which LED segments are driven by the corresponding signals carried by the various input pins.

Figure 4:
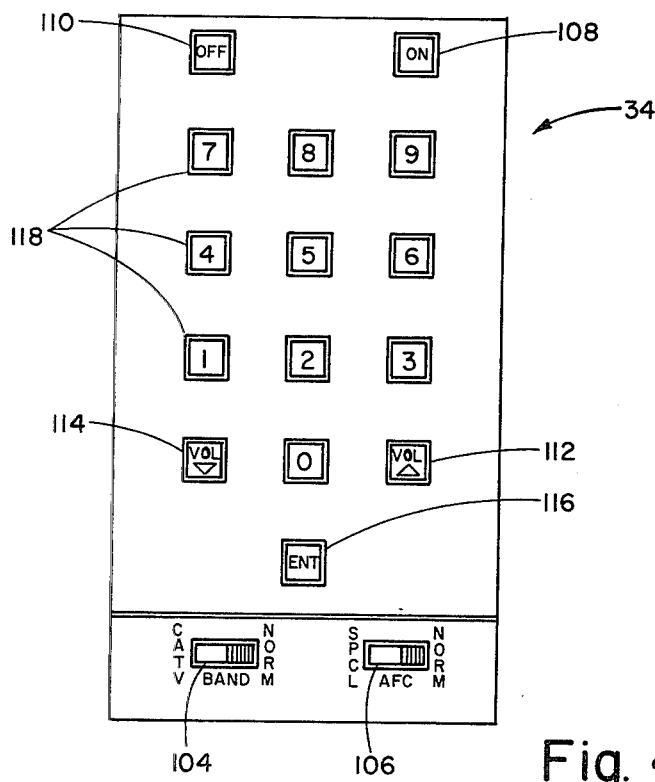
FIG. 4 shows the arrangement of selectable controls on the face of the channel number entry keyboard.

The channel number selector keyboard 34 is shown in FIG. 4. It includes 15 pressure actuated switches and two two-position switches for user control of the television receiver. The two-position band selector switch control 104 enables the user to elect to receive either the UHF channels 14 to 83 or the CATV channels "A" through "W" on displayed channels 14 through 36, respectively. The two-position AFC selector switch control 106 enables the user to select between pure phase lock loop operation (normal mode) or AFC operation (special mode) for non-standard signals. In the normal mode, the system puts the tuner oscillator exactly on the FCC designated frequency. If there is any tuner drift, the system will automatically correct the tuning voltage to compensate for it. The special AFC position is only used for unique situations where the incoming frequency is off from the FCC designated standard enough to cause noticable detuning of the picture and operates as previously described. Pressure sensitive ON and OFF selector switches, 108 and 110 respectively, provide for turning the receiver on and off. Pressure sensitive VOLUME UP and VOLUME DOWN switches, 112 and 114 respectively, provide incremental stepping of receiver volume by the user. Channel selection is made by means of digit selector keys 0 through 9. Three output scan lines are arranged in such a way as to represent the vertical X-axis of the keyboard 34 (three vertical rows of keys). The horizontal Y-axis of the keyboard is represented by five output lines. When a key is depressed, the appropriate X-Y contact is made. The contact closure transfers the pulse back to the microcomputer 40 via one of the five output lines. The microcomputer detects the pulse, producing the desired digit on the display while taking key bounces into consideration. A channel may be selected by entering the desired channel number and then depressing the pressure sensitive "ENTER" key 116. The selected number is displayed immediately upon selection by means of the pressure sensitive digit keys 118 on the keyboard 34. However, the television receiver remains tuned to the currently tuned channel unless the "ENTER" key 116 is selected within 4.5 seconds of channel number entry. IF the "ENTER" key is selected within 4.5 seconds of channel number entry, channel number information stored in RAM display memory location is transferred to RAM tuning memory location and the television receiver is tuned to the newly selected channel. If the "ENTER" key is not selected within 4.5 seconds of channel number entry the television receiver is not tuned to another channel and tuning information stored in RAM tuning memory location is transferred to RAM display storage memory location with channel number display reverting to the originally selected channel. In this manner, the LED display always indicates the channel actually being viewed after the 4.5 second interval following channel number entry. If an illegal channel is entered such as 00, 01, 84 through 99, the system remains tuned to the original channel with the channel number display reverting to the original channel number when the "ENTER" button is depressed. This method of direct access channel entry eliminates the requirement for entering two digits in selecting channels designated by numbers less than 10 and the complexity associated with additional shift registers and other supporting circuitry.

ON/OFF control of the Remote Control receiver 88 is provided by ON/OFF switches, 108 and 110 respectively, on the keyboard 34. A 12 volt source provides power to the ON/OFF switches and volume controls 112 and 114. A microphone and preamp 94 provide an interface for the space command receiver 88 with the remote controller 36. Coded ultrasonic signals are received by the microphone and preamp 94 from the remote controller and are transmitted to the space command receiver 88. The microcomputer 40 scans the space command receiver 88 in the same manner as it scans the keyboard 34 by providing a return path for microcomputer generated output signals. The keyboard 34 is connected to a ground plane shield 96 to avoid random input signals from either other signal sources, e.g., other appliances, or to preclude random, spurious inputs to the keyboard from arcing within the television receiver itself.

The microcomputer 40 receives a 200 Hz timing pulse at pins SNSO from phase lock loop 50 output pin TM0. This clock signal is generated by the phase lock loop reference crystal oscillator 60. Channel timing and AFT data is transmitted from microcomputer output pins DO0 through DO3 to phase lock loop input pins PI0 through PI3. Microprocessor outputs EO0 through EO3 are transmitted to phase lock loop inputs CI0 through CI2 and LD1 pins. Data entering on pin CI0 through C12 establish which data latches to which the microcomputer inputs are to be addressed while data transmitted to the LDI pin provides the command to load data in the phase lock loop chip 50. LFI input pin carries the divided down prescaler output from the tuner local oscillator 62. Input pins Q1 and Q0 couple the reference crystal circuit 60 to the phase lock loop 50 to generate the reference oscillator signal. Phase lock loop tuner control output PD0 is transmitted to integrating and filtering circuitry 66 and is then fed back to the tuner for control of the local oscillator 62.

AFC "window" information regarding a restricted frequency range about the nominal carrier frequency of a desired channel is transmitted through input BI1 to the microcomputer 40 from the phase comparator 52. AFC edge/direction information regarding tuning direction along the AFC tuning curve toward the nominal carrier frequency of a desired channel is transmitted through input pin BI2 to the microcomputer 40 from the phase comparator 52. The microcomputer receives vertical sync information at input SNSI from the phase comparator 52. The microcomputer outputs VHF high/low band switching information to the tuner 62 via output pin CO7. B+ switching data for VHF or UHF bands is transmitted by the microcomputer 40 via output pin CO8 to switching circuitry 54 and then to the tuner 62. The band switching interface circuit 54 provides proper tuner voltage for each selected channel. CATV band switch information is transmitted by the microcomputer via output CO9 to tuner 62.

The manner in which digital signals are processed in the channel number entry system in controlling various tuner system components during the channel selection process will now be explained with reference to the flow chart shown in FIG. 5. In referring to FIG. 5 an oval symbol indicates the start of an operational sequence, a rectangle indicates an instruction or set of instructions resulting in the performance of a control function and a diamond indicates a decision point based upon the comparison of binary signal inputs.

POWER ON

Figure 5:
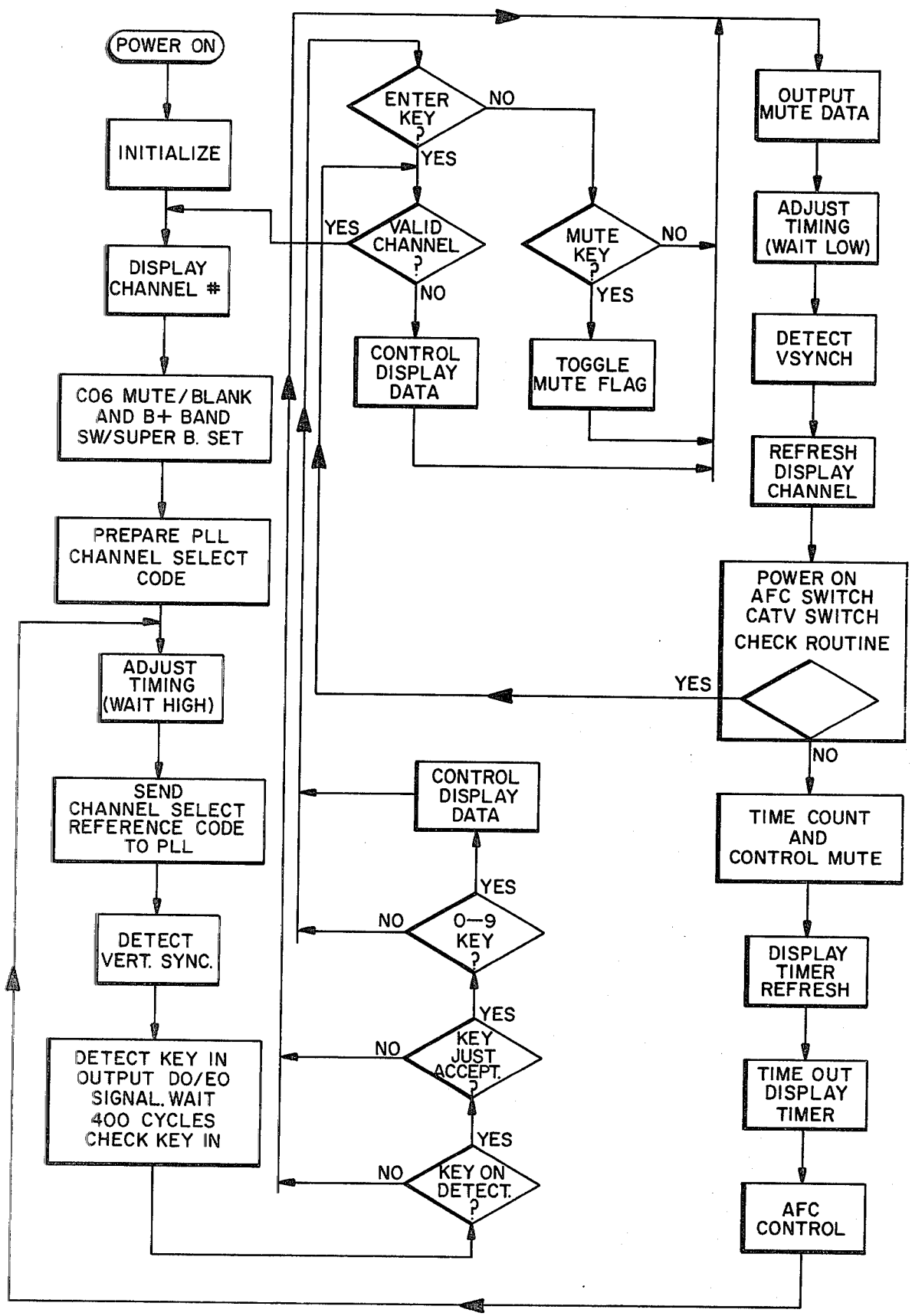
FIG. 5 is a detailed flow chart showing digital signal flow among the various components of the television receiver during entry of a selected channel number in accordance with the present invention.

As indicated in FIG. 5, power must be applied to the television receiver before the channel number entry process is initiated. The ROM, possessing a non-volatile memory, retains stored data without power applied to the television receiver. The RAM, possessing a volatile memory, looses stored data when power is removed from the television receiver with the result that data must be again stored in RAM when power is again applied to the television receiver.

INITIALIZE

The microcomputer 40 turns itself on when power is applied to the television receiver. Thereafter memory storage locations in the RAM 74 and other portions of the microcomputer 40 are initialized to predetermined conditions established by outputs from the ROM 72. Data transferred from ROM 72 to RAM 74 includes program operating instructions and constants, e.g., tuning data, keyboard scanning data, etc. Instructions output by the ROM 72 are decoded by the microcomputer controller 76 before being transmitted to the various microcomputer control elements. Control logic in the form of the microcomputer's arithmetic logic unit (ALU) 78 then implements these instructions.

DISPLAY CHANNEL NUMBER

When power is initially applied to the television receiver channel number 2 is presented on the LED display 44. Upon turning the television receiver "off" and then "on", the previously tuned to channel number will be recalled from RAM 74 and presented in the LED display 44. Upon power interruption to the television receiver the contents of the RAM 74 is erased with the result that upon reapplication of power channel number 2 will be presented in the LED display 44 and will be tuned to by the receiver.

CO6 MUTE/BLANK AND CO7, CO8, CO9 BANDSWITCH/B+/CATV SUPERBAND SET

Upon the decoding of channel number data by means of a set of instructions in ROM 72 and the display of the selected channel number, the microcomputer outputs control signals via the CO6 output terminal to the receiver sound and blank circuits. These output signals mute the sound and CO9 provide proper bandswitch, B+, and CATV switch voltages, respectively, to the appropriate tuning band for selected channel reception.

PREPARE PLL CHANNEL SELECT CODE

With the display channel number decoded by the microcomputer, appropriate tuning data is generated by programs in ROM 72 and stored in RAM 74 for transfer to the PLL 50. The CATV flag (High/Low), AFC flag, and the selected channel number provide the microcomputer 40 with the necessary inputs for generation of this PLL coded tuning data.

ADJUST TIMING

The microcomputer then looks at the system clock as generated by the reference crystal oscillator 60 in the PLL the output of which is divided by the reference divider 46 to produce a 200 Hz clocking signal to which all system processes are synchronized. The microcomputer 40 then waits for a high to low transition of the timing pulse in establishing a timing reference signal from which all tuning steps are measured.

SEND CHANNEL SELECT REFERENCE CODE TO PLL

After system timing is established the microcomputer 40 then sends the reference coded channel select tuning data to the PLL where it is addressed to appropriate latches in providing inputs to the variable divider 48 and the reference divider 46.

DETECT VERTICAL SYNC

The microcomputer then compares frequency, amplitude and duty cycle of the received signal with corresponding reference data stored in memory in detecting the presence or absence of a vertical sync signal.

DETECT KEY IN, OUTPUT DO/EO SIGNAL, WAIT 400 CYCLES, CHECK KEY IN

Depression of a key on the keyboard 34 is then detected by the microcomputer by means of scanning signals output by the microcomputor output terminal groups DO and EO. The system then waits 400 cycles which is twice the program period in executing a key debounce routine to allow for keyboard entry stabilization and the rejection of spurious signals which occur only once in a given cycle. Following this 400 cycle interval the system then retransmits its keyboard scanning signals to allow for the detection of key depression. If a key input is accepted, data corresponding to that key is stored in RAM for later use.

KEY ON DETECTED

The program then arrives at its first decision point at which key selection is determined followed by appropriate program branching. At this point in the program the system determines merely if a key has or has not been selected. The program has not yet determined whether a selected key is a numeric key, the "ENTER" key, or the mute key on the remote controller 36. However, at this point the program is able to sense whether an input signal represents a valid key selection or a spurious signal or an illegal entry. If a valid key entry is not detected the program proceeds to the OUTPUT MUTE DATA routine which will be described later. If a valid key entry is detected the program branches to the KEY JUST ACCEPTED routine.

KEY JUST ACCEPTED

The program then undergoes a detailed analysis in determining whether a valid or invalid key has been selected. It eliminates erroneous keying inputs such as multiple key entries, key debounce inputs, etc.

ZERO TO NINE KEY

The microcomputer 40 then checks RAM key data for a possible branch to the CONTROL DISPLAY DATA routine. If the key was not numeric the program branches to the ENTER KEY routine.

CONTROL DISPLAY DATA

If one of the numeric keys has been selected the appropriate input is provided by the keyboard 34 to the decoder drivers 42 in presenting the selected channel number on the digital display 44.

ENTER KEY

Whether or not a numeric key has been selected the program then proceeds to the "ENTER" routine which checks to see if the channel number selected is a valid channel number or an illegal channel number. This is done by comparing the selected channel number with the contents of the microcomputer memory resulting in the erasure of the channel number from the digital display 44 if the channel number selected is illegal. The illegal channel number is then replaced with the previously selected channel number and the program continues to the OUTPUT MUTE DATA.

VALID CHANNEL

If the result of the ENTER KEY inquiry indicates that a valid channel has been selected the program proceeds to the VALID CHANNEL routine and from there branches back to the start of the channel entry program. If the VALID CHANNEL check indicates an invalid channel has been received the program proceeds to the CONTROL DISPLAY DATA routine.

CONTROL DISPLAY DATA

This routine exercises control over the channel number display and reverts the channel number indicator to the previously selected channel if an illegal channel number has been entered.

MUTE KEY

If the ENTER KEY check indicates a numeric key entry the program branches to the MUTE KEY test which checks to see if the MUTE KEY has been selected on the remote controller 36. If the output of this test indicates that the MUTE KEY has been selected, the program executes a toggling of the mute flag thus inverting its state and thereby temporarily defeating the sound output. This muting occurs via remote control. If the MUTE KEY has been selected, the muting remains until the user hits the MUTE KEY again, toggling the system back to the unmuted state. The system incorporates a second mute flage controlled by tuning operations for muting the system during channel selection. The state of the MUTE KEY is thus the last user input control tested by the program.

TOGGLE MUTE FLAG

The mute flag is toggled upon detection of selection of the MUTE KEY and thus results in an inversion in the state of the toggle mute flag and the resulting defeat of the sound output. If the output of the MUTE KEY flag indicates that the MUTE KEY has not been selected the program continues to the OUTPUT MUTE DATA routine.

OUTPUT MUTE DATA

If the key mute flag is high, the OUTPUT MUTE DATA routine mutes the television receiver sound output and proceeds to a system timing function. The sound will remain muted until remote control inverts the key mute flag. A second mute flag is controlled by tuning operations and temporarily mutes the sound only during tuning operations.

ADJUST TIMING

The ADJUST TIMING routine permits the program to idle at a low timing state looking for a transition from low to high before it continues on. A transition from low to high of the timing signal would establish the one-half period mark of program execution and thus tells the microcomputer when one-half of the program has been executed. The total program is executed in five milliseconds with this ADJUST TIMING routine set in the program at approximately the 2.5 millisecond point.

DETECT VERTICAL SYNC

Following the adjustment of program timing the program again looks for the presence of a vertical sync signal by monitoring frequency amplitude and duty cycle.

REFRESH DISPLAY PANEL

The program then recalls the selected channel number from RAM 74 and transmits appropriate signals to the LED display 44 every 5 milliseconds.

POWER ON/AFC SWITCH/CATV SWITCH CHECK ROUTINE

The program then looks at the status of the power switch. If the switch is off it idles, continuously testing the status of the power switch. If the result of this test indicates that the power switch is on, it continues in the program checking the status of the AFC and the CATV switches. If a change in state of any one of these three checks is sensed by the microcomputer the program is directed back to the VALID CHANNEL check. If the result of this routine indicates that the power switch is on or that the state of the AFC switch or CATV switch has not been changed since the last cycle of the program the program continues onto the TIME COUNT AND CONTROL MUTE routine.

TIME COUNT AND CONTROL MUTE

This routine counts system clocking pulses to see if a predetermined period of time has expired and mutes system sound during this predetermined time period. In the present system the predetermined time period is set at 200 milliseconds.

DISPLAY TIMER REFRESH

In this routine the microcomputer updates display timer RAM data and once again recalls from RAM 74 the channel number and transmits appropriate data to the LED display 44 based on the timer data.

TIME OUT DISPLAY TIMER

Following the second program update of the digital display, the system then checks to see of the "ENTER" key has been selected within 4.5 seconds of channel number entry. This is accomplished by the TIME OUT DISPLAY TIMER routine which causes the channel number display to revert to the previously selected channel number if the "ENTER" key is not selected within 4.5 seconds of channel number entry. This also results in the television receiver remaining tuned to the originally tuned to channel. If the "ENTER" key is selected within 4.5 seconds of channel number entry, the newly selected channel number remains displayed in the LED display 44 and the microcomputer provides the phase lock loop with appropriate tuning data to tune to the displayed channel number.

AFC CONTROL

Following the tuning to a new channel the program executes an AFC CONTROL routine in more accurately tuning in to the newly selected channel. The routine is bypassed if the AFC switch is in the "NORMAL" position for pure PLL operation. AFC control is independent of the 4.5 second "ENTER" key interval, but is active after a new channel is tuned to only after 200 milliseconds, if the AFC switch is in the "SPECIAL" position. Details of the AFC CONTROL routine are described in Patent Application Ser. No. 107,732, filed Feb. 19, 1980, entitled "Microcomputer-Controlled One-Step-Back Automatic Frequency Control System", in the name of Peter C. Skerlos, which is assigned to the same assignee of the present application.

Table 2 includes the detailed microcomputer program control instruction listing utilized in the channel number entry system of the present invention. As indicated by the statement numbers of the various instructions, the channel number entry routine is distributed throughout the overall channel tuning program. The channel number entry routine is comprised of the following six primary operations, presented in the order in which they occur:

(1) Keyboard Scan (Starting Statement #421)
(2) Keyboard Sense (Starting Statement #1009)
(3) AFC/CATV Switch Scan (Starting Statement #805)
(4) Key Accepted/Display Data (Starting Statement #721)
(5) Enter Key/Valid Channel (Starting Statement #517)
(6) Recall Old Display (Starting Statement #584)

It is to be noted that operations (2) and (3) occur nearly simultaneously.

TABLE I

```
1171  ****************************************************************
1172  *                                                                *
1173  *                    READ WRITE LEVEL SET                        *
1174  *                                                                *
1175  *                         (RWSET)                                *
1176  *                                                                *
1177  *   THE VALUE OF THE ABSOLUTE ADDRESS IS COMPARED TO THE CONSTANTS *
1178  *   W,X,& Y.  THE READ/WRITE LEVEL CONTROL LINES ARE SET AS FOLLOWS: *
1179  *                                                                *
1180  *                    IF         ADDRESS > Y    SET RW4           *
1181  *                    IF  Y  >   ADDRESS > X    SET RW3           *
1182  *                    IF  X  >   ADDRESS > W    SET RW2           *
1183  *                    IF  W  >   ADDRESS > 0    SET RW1           *
1184  *         THE HOME ROUTINE IS THEN EXECUTED.                     *
1185  *                                                                *
1186  ****************************************************************
```

| | | | | | | | |
|---|---|---|---|---|---|---|---|
| 3 | 366 | 01001010 | 1188 | RWSET | TCY | RW1 | ADDR RW LINE 1 |
|  | 34E | 00001100 | 1189 | RWSETA | RSTR |  | RESET RW LINE |
|  | 35D | 00101011 | 1190 |  | IYC |  | INCREMENT RW LINE ADDRESS |
|  | 37B | 01011001 | 1191 |  | YNEC | RW5 |  |
|  | 377 | 10110011 | 1192 |  | BR | RWSETA | IF RW LINE ADDRESS NOT GREATER THAN RW4 BRANCH |
|  |  |  | 1193 | * |  |  | AND RESET NEXT LINE |
|  | 369 | 00111101 | 1194 |  | LDX | 2 | GET PAGE WITH Y |
|  | 356 | 11011001 | 1195 |  | CALL | LDCMP | LOAD ADDRESES OF Y AND ABSOLUTE ADDRESS. |
|  | 36D | 00011100 | 1196 |  | CALLL | COMP | COMPARE ABSOLUTE ADDRESS AND Y |
|  | 358 | 11000011 | 1197 |  |  |  |  |
|  | 372 | 01110000 | 1198 |  | ALEC | 0 |  |
|  | 360 | 10010101 | 1199 |  | BR | STRW4 | IF ABSOLUTE ADDRESS > Y, SETRW4 |
|  | 341 | 00111110 | 1200 |  | LDX | 1 | GET PAGE WITH X |
|  | 345 | 11011001 | 1201 |  | CALL | LDCMP | LOAD ADDRESSES OF X AND ABSOLUTE ADDRESS |
|  | 34B | 00011100 | 1202 |  | CALLL | COMP | COMPARE ABSOLUTE ADDRESS AND X |
|  | 354 | 11000011 | 1203 |  |  |  |  |
|  | 36C | 01110000 | 1204 |  | ALEC | 0 |  |
|  | 35F | 10010100 | 1205 |  | BR | STRW3 | IF ABSOLUTE ADDRESS > X, SETRW3 |
|  | 37A | 00111100 | 1206 |  | LDX | 0 | GET PAGE WITH W |
|  | 370 | 11011001 | 1207 |  | CALL | LDCMP | LOAD ADRESSES OF W AND ABSOLUTE ADDRESS |
|  | 351 | 00011100 | 1208 |  | CALLL | COMP | COMPARE ABSOLUTE ADDRESS AND W |
|  | 346 | 11000011 | 1209 |  |  |  |  |
|  | 4D | 01110000 | 1210 |  | ALEC | 0 |  |
|  | 35B | 10010000 | 1211 |  | BR | STRW2 | IF ABSOLUTE ADDRESS > W, SETRW2, |
|  | 374 | 01001010 | 1212 |  | TCY | RW1 | IF NOT SET. RW1 |
|  | 36F | 00001101 | 1213 | SET | SETR |  | SET RW LINE |

PAGE 172.

| PAG | LOC | OBJECT CODE | STMT | SOURCE STATEMENT | | | |
|---|---|---|---|---|---|---|---|
| 000 | 183 | 00011111 | 446 |  | BL | INIT | |
| 001 | 184 | 10000000 | 447 | | | | |
| | | | 448 | ●●●●●●●●●●●●●●●●●●●●●●●●●●●●●●●●●●●●●●●●●●●●●●●●●●●●● | | | |
| | | | 449 | ● | | | |
| | | | 450 | ● | | | |
| | | | 451 | ● | | | |
| | | | 452 | ● | HEAD IS MOVED IN 8 TRACK INCREMENTS | | |
| | | | 453 | ● | | | |
| | | | 454 | ● | | | |
| | | | 455 | ●●●●●●●●●●●●●●●●●●●●●●● | | | |
| 003 | 18C | 00111100 | 456 | FAST | LDX | 0 | |
| 007 | 19C | 01000001 | 457 | | TCY | 8 | |
| 00F | 18C | 00101111 | 458 | | CLA | | |
| 011 | 1AF | 00000011 | 459 | | TAM | | |
| 01F | 1BF | 01001110 | 460 | | TCY | 7 | |
| 01C | 189 | 00111111 | 461 | | RMIT | 3 | |
| 039 | 1B4 | 01000001 | 462 | | TCY | 8 | |
| 038 | 1A6 | 00100011 | 463 | | TYA | | |
| 017 | 19C | 01001110 | 464 | | TCY | 7 | |
| 02F | 1B0 | 00110101 | 465 | | AMAAC | | |
| 01F | 1B8 | 00000011 | 466 | | TAM | | |
| 01C | 1B1 | 00111110 | 467 | | LDX | 1 | IS TRCNT = 0? IF SO RETURN TO CONTROL. |
| 039 | 1A6 | 01001111 | 468 | | TCY | 7 | |
| 013 | 1BF | 01001110 | 469 | | MNEZ | | |
| 02F | 193 | 10010110 | 470 | | BR | SDIRCT | |
| 036 | 188 | 01000001 | 471 | | TCY | 8 | |
| 010 | 187 | 00101110 | 472 | | MNEZ | | |
| 01A | 1A2 | 10010110 | 473 | | BP | SDIRCT | |
| 035 | 196 | 00011001 | 474 | | BL | SSTEP | |
| 02A | 1A9 | 10000010 | 475 | | | | |
| 016 | 17A | 01001111 | 476 | SDIRCT | TCY | DIRECT | DETERMINE DIRECTION OF MOVE |
| 02C | 1A7 | 00111001 | 477 | | TMIT1 | ? | |
| 014 | 1A0 | 10101110 | 478 | | BR | STEPR | REVERSE. GET ACCELERATE REVERSE INSTRUCTION |
| 010 | 191 | 01001110 | 479 | STEPF | TCY | ACCELFWD | FORWARD. GET ACCELERATE FORWARD INSTRUCTION |
| 021 | 185 | 00100011 | 480 | GC | TYA | | |
| 002 | 188 | 00001010 | 481 | | TAM | | |
| 005 | 194 | 01001001 | 482 | | TCY | 9 | OUTPUT ACCELERATE INSTRUCTION |
| 008 | 1AC | 01101001 | 483 | | TCMIY | 7 | |
| 017 | 195 | 01001001 | 484 | | TCY | 9 | |
| 02F | 196 | 00001000 | 485 | SEOZ | TKA | | LOOK FOR POSITIVE TRANSITION OF SMSRNL |
| 01C | 190 | 01111110 | 486 | | ALEC | 1 | |
| 019 | 1A1 | 10101110 | 487 | | BR | SEOZ | NOT YES..KEEP LOOKING |
| 031 | 186 | 00001000 | 488 | SE02A | TKA | | YES, NOW LOOK FOR NEGATIVE TRANSITION |

| | | | | | | |
|---|---|---|---|---|---|---|
| 023 | 180 | 01111110 | 489 | | ALEC | 7 |
| 00A | 198 | 10011011 | 490 | | BR | ACNT | YES, SET DIRECTION TO DECELERATE |
| 030 | 184 | 13110301 | 491 | | BR | SEOZA | NO, KEEP LOOKING |
| 01B | 1AF | 00101000 | 492 | ACNT | TAMC | |
| 016 | 199 | 13110130 | 493 | | BR | STEPDIR | |
| 02D | 1A5 | 00333011 | 494 | | TAM | | |
| 01A | 1AA | 10101110 | 495 | | BR | SEQZ | |
| 014 | 191 | 01011111 | 496 | STEPDIR | TCY | DIRECT | DETERMINE DIRECTION OF MOVE. |
| 029 | 1A5 | 00111001 | 497 | | TBIT1 | 2 | |
| 017 | 180 | 10011001 | 498 | | BR | STPDCR | REVERSE, GET DECELERATE REVERSE INSTRUCTION |
| 024 | 192 | 01001101 | 499 | | TCY | DECELFWD | FORWARD, OUTPUT DECELFWD INSTRUCTION |
| 009 | 1A3 | 00100011 | 500 | STEPOUT | TYA | | |
| 011 | 197 | 00001013 | 501 | | TDO | | |
| 072 | 184 | 00011110 | 502 | | BL | S2A | |
| 014 | 193 | 10001011 | 503 | | | | |
| 037 | 1A6 | 01001110 | 504 | STPDCR | TCY | DECELREV | GO OUTPUT DECELERATE REVERSE INSTRUCTION |
| 011 | 10F | 10001000 | 505 | | BR | STEPOUT | |
| 02A | 19A | 01001101 | 506 | STEPR | TCY | ACCELREV | |
| 03C | 1B7 | 10100001 | 507 | | BR | GO | |
| | | | 508 | | PAGE | | |

PAGE NO. 7

PAD LOC OBJECT CODE STMT SOURCE STATEMENT

| | | | | | | |
|---|---|---|---|---|---|---|
| 000 | 1C3 | 00011111 | 509 | | BL | INIT |
| 001 | 1C4 | 10000000 | 510 | | | |
| 005 | 1CC | 01001101 | 511 | S2A | TCY | 4 |
| 037 | 1DC | 01101001 | 512 | | TCMIY | 9 |
| 03F | 1FC | 01001001 | 513 | | TCY | 9 |
| 01F | 1FF | 00001000 | 514 | S2 | TKA | |
| 03F | 1FF | 01111110 | 515 | | ALEC | 7 |
| 01F | 1F9 | 10011111 | 516 | | BR | S2 | KEEP TESTING FOR SNSANL HIGH |
| 03D | 1F4 | 00001000 | 517 | S3 | TKA | |
| 038 | 1EF | 01111110 | 518 | | ALEC | 7 |
| 017 | 10E | 10011110 | 519 | | BR | DCNT |
| 0FF | 1FD | 10111101 | 520 | | BR | S3 |
| 01C | 1F8 | 00101000 | 521 | DCNT | TAMC | |
| 01C | 1F1 | 10100111 | 522 | | BR | S4 |
| 019 | 1FA | 00000001 | 523 | | TAM | |
| 013 | 1CL | 10011111 | 524 | | BR | S2 |
| 027 | 1DD | 00011001 | 525 | S4 | CALLL | DCRAD |
| 02E | 1F8 | 11111101 | 526 | | | |
| 010 | 1F7 | 00111010 | 527 | | TBIT1 | 1 |
| 014 | 1C9 | 10010010 | 528 | | BR | TSDIRCT |
| 019 | 106 | 00011001 | 529 | | BL | SSTEP |
| 02B | 1CD | 10003011 | 530 | TSDIRCT | BL | SDIRCT |
| 016 | 108 | 00010110 | 531 | | | |
| 02C | 1F7 | 100.0110 | 532 | | | |
| 018 | 1F0 | 00111100 | 533 | TKONITST | LDX | 0 |
| 019 | 1C1 | 01000011 | 534 | | TCY | 12 | IF MOTOR NOT LOCKED, SET SEEKR, AND DONT MOVE. |
| 071 | 1C5 | 00111010 | 535 | | TBIT1 | 1 |
| 012 | 1CB | 10011100 | 536 | | BR | TOTR |
| 024 | 1B4 | 01001100 | 537 | | TCY | SEEKR |
| 009 | 1CC | 00001101 | 538 | | SETR | |
| 017 | 109 | 00010001 | 539 | | BL | SCAN |
| 02F | 1FA | 10001111 | 540 | | | |
| 01C | 1F3 | 00111111 | 541 | TOTR | LDX | 3 |
| 030 | 1E1 | 00010101 | 542 | | BL | NEWADDR |
| 031 | 1C6 | 10000011 | 543 | | | |
| 023 | 1CD | 00101110 | 544 | | XMA | |
| | | | 545 | | PAGE | |

TABLE II

| | | | | | |
|---|---|---|---|---|---|
| 111 | | 611 | | BL | INIT |
| 000 | | 612 | | | |
| 000 | | 613 | | TCY | PTRLK |
| 101 | | 614 | | SETR | |
| 011 | | 615 | | TCY | 12 |
| 010 | | 616 | | SBIT | 1 |
| 001 | | 617 | | BL | TEST2 |
| 001 | | 618 | | | |
| | | 619 | *************************************************** |
| | | 620 | * | |
| | | 621 | * HEAD IS MOVED IN SINGLE TRACK INCREMENTS |
| | | 622 | * |
| | | 623 | * |
| | | 624 | *************************************************** |
| 1110 | | 625 | DCRAD | TCY | 7 | DECREMENT LSN |
| 1010 | | 626 | | DMAN | |
| 0011 | | 627 | | BR | DCRNR | NO BORROW OCCURED DONT DCRMSN |
| 0009 | | 628 | | TAMIY | | STORE LSN GETMSN |
| 1010 | | 629 | | DMAN | | DECREMENT MSN |
| 0011 | | 630 | | TAM | | STORE MSN |
| 0111 | | 631 | | BR | DCRTST | GO TEST MSN |
| 0009 | | 632 | DCRNR | TAMIY | | STORE LSN GET MSN |
| 0110 | | 633 | DCRTST | MNEZ | | MSN=0? |
| 1000 | | 634 | | BR | DCRCONT | NO, CONTINUE |
| 1110 | | 635 | | TCY | 7 | YES, GET LSN |
| 0110 | | 636 | | MNEZ | | LSN=0? |
| 1000 | | 637 | | BR | DCRCONT | NO, CONTINUE |
| 0111 | | 638 | | TCY | 14 | YES, GET FLAGS |
| 0110 | | 639 | | RBIT | 1 | SET MEM=0 FLAG |
| 1111 | | 640 | | RETN | | |
| 0111 | | 641 | DCRCONT | TCY | 14 | GET FLAGS |
| 0010 | | 642 | | SBIT | 1 | SET MEM=0 FLAG |
| 1111 | | 643 | | RETN | | |
| 1100 | | 644 | SSTEP | LDX | 0 | |
| 1110 | | 645 | | TCY | 7 | |
| 0110 | | 646 | | MNEZ | | |

```
100110        647              BR    SSDIRCT
000001        648              TCY   0
100110        649              MNEZ
000110        650              BR    SSDIRCT
010101        651              BL    SSETTPU
100011        652
001111        653   SSDIRCT    TCY   DIRECT
111001        654              TBIT1 2
010000        655              BR    SSTEPR
001110        656   SSTEPF     TCY   ACCELFWD
100011        657              SGO   IYA
001010        658              TDO
001000        659   SSEQZ      TKA
111110        660              ALEC  7
110100        661              BR    SSEQZ
001000        662   SSEQZA     TKA
111110        663              ALEC  7
000100        664              BR    SSTEPDIR
100100        665              BR    SSEQZA
001111        666   SSTEPDIR   TCY   DIRECT
111001        667              TBIT1 2
010100        668              BP    SSTEPCR
001101        669              TCY   DECELFWD
100011        670   SSTEPOUT   IYA
100011        671              IYA
100011        672              IYA
100011        673              IYA
001010        674              TDO
010101        675              BL    SS2
110101        676
001110        677   SSTPDCR    TCY   DECELREV
001100        678              BR    SSTEPOUT
001101        679   SSTEPR     TCY   ACCELREV
101101        680              BR    SGO
              681              PAGE
```

PAGE NO. 10

```
PAG  LOC   OBJECT CODE    STMT    SOURCE STATEMENT 000  283   00011111       682           BL    INIT
001  284   10000000       683
                          684    *************************************************
                          685    *                                                *
                          686    *                   NEWADDR                      *
                          687    *                                                *
                          688    * THE DIRECTION TO BE MOVED IS DETERMINED. THE NEW ADDRESS IS *
                          689    * CALCULATED AND TESTED TO DETERMINE VALIDITY:   *
                          690    *                                                *
                          691    *        0 < VALID ADDRESS < MAXTRACK            *
                          692    *                                                *
                          693    * IF THE NEW ADDRESS IS INVALID, THE OLD ADDRESS IS SAVED AND *
                          694    * THE PROGRAM RETURNS TO THE SCAN ROUTINE WITH THE SEEK ERROR *
                          695    * SIGNAL ACTIVE. IF THE NEW ADDRESS IS VALID, IT IS SAVED,    *
                          696    * SEEK ERROR IS RESET AND THE PROGRAM EXECUTES THE MOVE ARM   *
                          697    * ROUTINES.                                      *
                          698    *                                                *
                          699    *************************************************
003  29C   01001001       700    NEWADDR  TCY  9        ADD 14 TO ADDRESS.
007  29C   01101110       701             TCMIY 7
00F  29C   01100010       702             TCMIY 4
01F  29E   00011000       703             CALLL ADD
01F  29E   11000011       704
03F  29F   01001001       705             TCY   5       IS ADDRESS GREATER THAN MAX TRACK?
03D  286   01101110       706             TCMIY 7
03B  2AE   01100100       707             TCMIY 2
037  291   00011100       708             CALLL COMP
02F  290   11000011       709
01E  280   01001100       710             TCY   SEERR
01C  281   01110000       711             ALEC  0
038  2A6   10011101       712             BR    TWHICHWY  NO, CALCULATE NEWTRGCNT
011  20C   00001101       713             SETR            YES, SET SEERR AND WAIT FOR NEW ADDRESS.
037  290   00001001       714             BL    SCAN
06F  2C8   10001111       715
01D  207   00011101       716    TWHICHWY  BL   WHICHWY
01A  2A9   10000011       717
015  296   00001000       718    SS2       TKA
029  2A0   01111110       719              ALEC 7
016  291   10110101       720              BR   SS2
02C  282   00001000       721    SS3       TKA
018  240   01111110       722              ALEC 7
030  281   10000010       723              BR   SS4
021  249   10101100       724              UP   SS3
002  280   00001001       725    SS4       CALLL UGRAD
025  294   11111101       726
008  29C   00111010       727              TBIT1 1
017  20F   10101001       728              BR   SSDIRG
00F  29A   01000101       729              TCY   13
00C  290   01101111       730              TCMIY 15
038  241   00110000       731              IMAC
011  286   10100011       732              BR   SSETTRU
023  280   01000100       733    SSETTRU   TCY  TRUENUL
005  298   00100011       734              IYA
000  204   00001010       735              TDO
01A  21F   00011011       736              CALLL SETTLE
036  277   11000011       737
029  215   00111100       738              LDX  0
01A  248   00010111       739              BL   CONTROL
036  291   10000011       740
009  245   00011001       741    SSDIRG    BL   SSDIRCT
012  288   10000110       742
                          743              PAGE
```

TABLE III

```
                    1085  *****************************************************************
                    1086  *                                                                *
                    1087  *                              ERRASE                            *
                    1088  *                                                                *
                    1089  *    WHEN AN ERRASE COMMAND IS RECEIVED, THE ARM POSITION WILL   *
                    1090  *    BE OFFSET IN THE OPPOSITE DIRECTION FROM WHICH IT HAS LAST  *
                    1091  *    OFFSET. THE INPUTS ARE MONITORED FOR THE TERMINATION OF THE *
                    1092  *    ERRASE COMMAND OR A LOSS OF THE SENSORNUL SIGNAL. WHEN      *
                    1093  *    TERMINATED NORMALLY THE OFFSET IS REMOVED AND THE PROGRAM   *
                    1094  *    RETURNS TO THE NORMAL SCAN ROUTINE. IF ANY OTHER INPUT GOES *
                    1095  *    HIGH IT IS ASSUMED TO BE A LOSS OF SENSORNUL, COMPLETE IS   *
                    1096  *    SET LOW AND CONTROL IS TRANSFERED TO THE ERROR ROUTINE.     *
                    1097  *                                                                *
                    1098  *****************************************************************
316  01000010       1100  ERRASE  TCY     4            GET LEAN FLAG
320  00111000       1101          TBIT1   0            TEST LEAN FLAG
318  10110110       1102          BR      SETLA        IF 1, LEANED B LAST TIME, LEAN A THIS TIME
 2   00110000       1103          SBIT    0            SET CLEAN FLAG
 3   01000101       1104          TCY     LEANB        LOAD LEAN B OUTPUT CODE
3C1  00100011       1105  OPERAS  TYA
305  00001010       1106          TDO                  OUTPUT LEAN INSTRUCTION
30B  00001000       1107  ERSTST  TKA                  INPUT K LINES
314  01001101       1108          TCY     11
32C  00000011       1109          TAM
31F  00111011       1110          TBIT1   3
33A  10100011       1111          BR      ERSERR
330  00111001       1112          TBIT1   2
321  10000010       1113          BR      ERSTST       IF K LINE = 1, ERRASE HIGH
306  10110100       1114          BR      CLRLN
300  01000000       1115  ERSERR  TCY     CMPLT        MUST BE SNSRNL
31B  00001100       1116          RSTR                 RESET COMPLETE LINE
334  00011010       1117          BL      ERROR        BRANCH TO ERROR ROUTINE
32F  10000011       1118
319  00110100       1119  SETLA   RBIT    0            RESET LEAN FLAG
335  01000110       1120          TCY     LEANA        LOAD LEANA OUTPUT CODE
328  10110000       1121          BR      OPERAS       BRANCH TO OUTPUT INSTRUCTION
311  01000100       1122  CLRLN   TCY     TRUENUL      LOAD TRUENL OUTPUT CODE
325  00100011       1123          TYA
 8   00001010       1124          TDO                  OUTPUT INSTRUCTION
 2   01001110       1125          TCY     7
323  01100000       1126          TCMIY   0            DELAY 3 MS. TO ALLOW THE POSITION SIGNAL,
307  01100111       1127          TCMIY   14           TO DROP BELOW THE NARROW SNSRNL THRESHOLD.
30A  01001110       1128  ERST    TCY     7
313  00100001       1129          THA
324  00101000       1130          IMAC
30F  10011001       1131          BR      ERST2
31A  00000011       1132          TAM
333  10100010       1133          BR      ERST
327  00100000       1134  ERST2   TAMIY
309  00100001       1135          THA
315  00101000       1136          IMAC
308  10010100       1137          BR      ERST3
317  00000011       1138          TAM
32A  10100010       1139          BR      ERST
310  00011000       1140  ERST3   BL      LOCKFIX      GO TO THE LOCKFIX ROUTINE ON ROM PAGE 1.
322  10100100       1141
```

TABLE IV

```
E NO. 5

LOC  OBJECT CODE    STMT    SOURCE STATEMENT 143  00011111       519             BL      INIT
  144  10000000       520
                      521     *****************************************************************
                      522     *                                                                *
                      523     *                              ERROR                             *
                      524     *                                                                *
                      525     *    THE ERROR ROUTINE RETURNS THE ARM TO THE HOME POSITION AND  *
                      526     *    THEN TRANSFERS THE LAST ADRESS FROM MEMORY TO TKCNT AND MOVES *
                      527     *    TO THAT POSITION. IF THE LAST ADDRESS WAS 00 THE MOVE ROUTINE *
                      528     *    WILL BRANCH BACK TO THE SCAN ROUTINE  ALLOWING THIS ROUTINE TO *
                      529     *    BE USED TO INITIALIZE THE ARM POSITION.                     *
                      530     *                                                                *
                      531     *****************************************************************

01000000       533     ERROR   TCY     CMPLT        RESET COMPLETE SIGNAL
       00001100       534             RSTR
  17C  00010111       535             BL      NEWERR       MOVE FORWARD M TRACKS
  17F  10000011       536
  17E  11110010       537     ERRORB  CALL    MUX3         SET MUX FOR HOME
  179  00001000       538             TKA
  176  01001101       539             TCY     11
```

TABLE IV (Cont'd.)

| | | | | | | | |
|---|---|---|---|---|---|---|---|
| 3 | 16E | 00000011 | 540 | | TAM | | |
| 7 | 15E | 00111010 | 541 | | TBIT1 | 1 | |
| = | 17D | 10111100 | 542 | | BR | EB | |
| E | 173 | 10001001 | 543 | | BR | EA | IF NOT HOME MOVE 1 TRACK REV |
| C | 171 | 01001111 | 544 | EB | TCY | FLAGS | SET FLAGS TO RETURN TO ERROR ROUTINE |
| 9 | 166 | 01100100 | 545 | | TCMIY | 2 | |
| 3 | 14E | 01001110 | 546 | | TCY | 7 | |
| 7 | 15D | 01101000 | 547 | | TCMIY | 1 | |
| E | 178 | 10100010 | 548 | | BR | MOVERR | MOVE 1 TRACK FORWARD |
| 0 | 177 | 11110010 | 549 | ERRORC | CALL | MUX3 | SET MUX FOR HOME |
| 1 | 169 | 00001000 | 550 | | TKA | | |
| 5 | 155 | 01001101 | 551 | | TCY | 11 | |
| 3 | 16D | 00000011 | 552 | | TAM | | |
| 5 | 158 | 00111010 | 553 | | TBIT1 | 1 | |
| C | | 10110000 | 554 | | BR | EC | |
| 9 | | 10001001 | 555 | | BR | EA | IF NOT HOME MOVE 1 TRACK REVERSE |
| 0 | 141 | 01001111 | 556 | EC | TCY | FLAGS | SET FLAGS TO RETURN TO ERROR ROUTINE |
| 1 | 145 | 01101010 | 557 | | TCMIY | 5 | |
| 2 | 145 | 01001110 | 558 | | TCY | 7 | |
| 5 | 154 | 01101000 | 559 | | TCMIY | NL | |
| 3 | 16C | 01101100 | 560 | | TCMIY | NM | |
| 7 | 15F | 10100010 | 561 | | BR | MOVERR | MOVE N TRACKS REVERSE |
| E | 17A | 11110010 | 562 | ERRORD | CALL | MUX3 | SET MUX FOR HOME |
| C | 170 | 00001000 | 563 | | TKA | | |
| 3 | 161 | 01001101 | 564 | | TCY | 11 | |
| 1 | 146 | 00000011 | 565 | | TAM | | |
| 3 | 14D | 00111010 | 566 | | TBIT1 | 1 | |
| 5 | 15B | 10011011 | 567 | | BR | ED | |
| D | 174 | 10001001 | 568 | | BR | EA | IF NOT HOME MOVE 1 TRACK REVERSE |
| 3 | 16F | 01000000 | 571 | ED | TCY | 0 | IF HOME, HOME. NOW GO TO LAST TRACK ADDRESS |
| | 159 | 00100001 | 572 | | TMA | | |
| 1 | 175 | 01001110 | 573 | | TCY | 7 | |
| 1 | 168 | C0000011 | 574 | | TAM | | |
| ' | 151 | 01001000 | 575 | | TCY | 1 | |
| : | 165 | 00100001 | 576 | | TMA | | |
| 2 | 143 | 01000001 | 577 | | TCY | 8 | |
| 1 | 152 | 00000011 | 578 | | TAM | | |
| 3 | 163 | 01001111 | 579 | | TCY | FLAGS | SET FLAGS FOR NORMAL FORWARD MOVE |
| 1 | 147 | 01100000 | 580 | | TCMIY | 0 | MOVE TO LAST TRACK ADDRESS |
| 2 | 14A | 00010110 | 581 | MOVERR | BL | STEP | |
| 1 | 153 | 10000011 | 582 | | | | |
| 1 | 164 | 01001111 | 583 | EA | TCY | FLAGS | SET FLAGS TO RETURN TO ERROR ROUTINE |
| 3 | 14F | 01101110 | 584 | | TCMIY | 7 | |
| 1 | 15A | 01001110 | 585 | | TCY | 7 | |
| 1 | 173 | 01101000 | 586 | | TCMIY | 1 | |
| 7 | 167 | 10100010 | 587 | | BR | MOVERR | MOVE 1 TRACK REVERSE |
| 2 | 149 | 01000100 | 588 | MUX3 | TCY | TRUENUL | LOAD OFLA WITH WORD FOR TRUENULL AND PROPER |
| 5 | 5 | 00100011 | 589 | | TYA | | MUX FOR INPUTING HOME SIGNALS |
| 1 | B | 00001010 | 590 | | TDO | | |
| 3 | 157 | 00001111 | 591 | | RETN | | |
| | | | 592 | | PAGE | | |

TABLE V

| | | | | | | | |
|---|---|---|---|---|---|---|---|
| 000 | 003 | 00011111 | 80 | | BL | INIT | |
| 001 | 004 | 10000000 | 81 | | | | |

```
82 ****************************************************************
83 *                                                              *
84 *                            CLEAN                             *
85 *                                                              *
86 *  THE CLEAN ROUTINE TURNS ON THE DISC MOTOR AND WAITS FOR IT TO *
87 *  COME UP TO SPEED. THE FRONT PANEL LITE IS TURNED ON UNTIL THE *
88 *  ROUTINE IS COMPLETE OR THE CARTRIDGE REMOVED. ONCE THE DISC   *
89 *  MOTOR IS UP TO SPEED THE HEAD IS MOVED FROM HOME TO TRACK 79  *
90 *  USING THE ERROR ROUTINE. THIS IS DONE 14 TIMES. THE HEAD IS THEN *
91 *  MOVED HOME AND LEFT THERE. THE FRONT PANEL LITE IS TURNED OFF *
92 *  SIGNALING COMPLETION OF THE ROUTINE.                         *
93 *                                                              *
94 ****************************************************************
```

| | | | | | | | |
|---|---|---|---|---|---|---|---|
| 003 | 00C | 01000000 | 96 | CLEAN | TCY | CMPLT | TURN ON LITE. |
| 007 | 01C | 00001100 | 97 | | RSTR | | |
| 00F | 03C | 01000011 | 98 | | TCY | LOCKFLG | TEST TO SEE IF DISC MOTOR IS LOCKED |
| 01F | 3F | 00111010 | 99 | | TBIT1 | 1 | |
| 03F | 3E | 10111011 | 100 | | BR | TCLN | MOTOR LOCKED, GO AHEAD WITH CLEAN ROUTINE |
| 03E | 039 | 00010001 | 101 | | BL | SCAN | MOTOR NOT LOCKED, GO BACK TO SCAN ROUTINE |
| 03D | 036 | 10001111 | 102 | | | | |
| 01D | 02E | 01001010 | 103 | TCLN | TCY | 5 | GET COUNTER |
| 03D | 01E | 00100001 | 104 | | TMA | | |
| 0CF | 03D | 01111011 | 105 | | ALEC | 13 | IS COUNTER < 14 ? |
| 01E | 038 | 10100011 | 106 | | BR | GOCLN | YES, GO MOVE HEAD. |
| 03C | 031 | 01110111 | 107 | | ALEC | 14 | IS COUNTER = 15 ? |
| 039 | 026 | 10000101 | 108 | | BR | GOHM | NO, MOVE HEAD HOME. |
| 033 | 00E | 01000000 | 109 | | TCY | CMPLT | YES, END OF CLEAN CYCLE, |
| 007 | 01D | 00001101 | 110 | | SETR | | TURN OFF LITE. |

```
00E  03B  01001100   111            TCY   TRUE2    SET MUX INPUT FOR CLEAN SIGNAL
010  037  00100011   112            TYA
03A  029  00001010   113            TDO
035  016  01001101   114            TCY   11
02B  02D  00011111   115   TSTCLN   LDP   15       LOOP UNTIL CLEANING CARTRIDGE IS REMOVED
016  018  00001000   116            TKA
02C  032  00000011   117            TAM
018  020  00111000   118            TEIT1 0        IS CLEAN HIGH ?
030  001  10000000   119            BR    INIT     YES, CLEANING CARTRIDGE OUT, REINITIALIZE.
02F  005  00010000   120            BL    TSTCLN   NO, WAIT FOR CLEAN TO GO HIGH.
0EE  09   10101011   121
005  014  00001110   122   GOHM     IA             INCREMENT COUNTER.
0CB  C2C  00000011   123            TAM
017  01F  01000000   124            TCY   0        LOAD ADDRESS EQUAL TO ZERO.
0CE  03A  01100000   125            TCMIY 0
01C  030  01100000   126            TCMIY 0
035  021  00011010   127   CLNERR   BL    ERROR    MOVE HEAD HOME.
031  006  10000011   128
023  00D  00001110   129   GOCLN    IA
0C6  01B  00000011   130            TAM             INCREMENT COUNTER.
0C0  034  01000000   131            TCY   0
01F  02F  01100111   132            TCMIY 14       SET ADDRESS FOR TRACK 79.
036  019  02101010   133            TCMIY 5
02C  035  10111000   134            ER    CLNERR   MOVE HEAD HOME THEN TO TRACK 79.
```

There has thus been provided a keyboard-operated, microcomputer-controlled method and apparatus for selecting a channel in a television receiver which significantly reduces the possibility of erroneous and illegal channel number entries. The storage of channel tuning data in memory permits the system to revert to the previously selected channel if the user becomes aware of the mistaken entry following channel number entry. This permits the television receiver to remain tuned to the previously selected channel following the entry of an erroneous channel number without any further action required on the part of the user. Selection of an illegal channel number produces no tuning change with the receiver remaining tuned to the previously selected channel and the channel number display reverting to the previously selected channel number after a predetermined time interval.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective against the prior art.

I claim:

1. In a television receiver tuning system controlled by a microcomputer wherein channel selection is by means of a keyboard including a plurality of selectable digit keys for generating binary signals representing television channel numbers with said binary signals being transmitted to said microcomputer for display on a digital display, for storage in a matrix memory in said microcomputer, and for controlling television receiver tuning circuitry, and a selectable enter key for tuning in a selected channel, a method of selecting a desired channel number by which the possibility of an erroneous channel number entry is reduced, said method comprising the steps of:

selecting the desired channel number by actuating said selectable digit keys on said keyboard and displaying the selected channel number on said digital display;

storing the selected channel number in said matrix memory in said microcomputer for a predetermined period of time;

actuating said enter key; and transmitting said selected channel number to tuning circuitry in said television receiver for tuning said television receiver to said selected channel number and retaining in said digital display the selected channel number if said enter key is selected within said predetermined period of time; or removing the selected channel number from memory storage in said microcomputer and from said digital display while remaining tuned to a currently tuned channel if said enter key is not selected within said predetermined period of time.

2. In a television receiver tuning system controlled by a microcomputer wherein channel selection is by means of a keyboard including a plurality of selectable digit keys for generating binary signals representing television channel numbers with said binary signals being transmitted to said microcomputer for display on a digital display, for storage in a matrix memory in said microcomputer, and for controlling television receiver tuning circuitry, and a selectable enter key for tuning in a selected channel, a method of selecting a desired channel number by which the possibility of an erroneous channel number entry is reduced, said method comprising the steps of:

selecting the desired channel number by actuating said selectable digit keys on said keyboard and displaying the selected channel number on said digital display;

storing said binary signals representing television channel numbers in first and second memory locations in said matrix memory of the microcomputer, said first memory location providing the selected channel number to said digital display and said second memory location providing the selected channel number to said channel tuning circuitry;

actuating said enter key; and transmitting said selected channel number to tuning circuitry in said television receiver for tuning said television receiver to said selected channel number and retaining in said digital display the selected channel number if said enter key is selected within said predetermined period of time; or removing the selected channel number from memory storage in said microcomputer and from said digital display while remaining tuned to a currently tuned channel if said enter key is not selected within said predetermined period of time.

3. In a television receiver tuning system controlled by a microcomputer wherein channel selection is by means of a keyboard including a plurality of selectable digit keys for generating binary signals representing television channel numbers with said binary signals being transmitted to said microcomputer for display on a digital display, for storage in a first matrix memory in said microcomputer, and for controlling television receiver tuning circuitry, and a selectable enter key for tuning in a selected channel, a method of selecting a desired channel number by which the possibility of an erroneous channel number entry is reduced, said method comprising the steps of:

selecting the desired channel number by actuating said selectable digit keys on said keyboard and displaying the selected channel number on said digital display;

storing said binary signals representing television channel numbers in first and second memory locations in said first matrix memory of the microcomputer, said first memory location providing the selected channel number to said digital display and said second memory location providing the selected channel number to said channel tuning circuitry;

actuating said enter key; and transmitting said selected channel number to tuning circuitry in said television receiver for tuning said television receiver to said selected channel number and retaining in said digital display the selected channel number if said enter key is selected within said predetermined period of time; or removing the selected channel number from memory storage in said microcomputer if the enter key is not selected within said predetermined period of time with the currently tuned channel number remaining in said second memory location, said microcomputer transmitting the contents of said second memory location to said first memory location thereby restoring the currently tuned channel number to said digital display.

4. The method of claim 3 further comprising the steps of:

storing in a second memory of said microcomputer illegal channel numbers;

reading said illegal channel numbers from said second memory and comparing the selected channel number with said illegal channel numbers; and tuning said television receiver to and displaying the selected channel number if the selected channel number is not one of the illegal channel numbers; or removing the selected channel number from storage in the microcomputer and remaining tuned to the currently tuned channel number if the selected channel number is one of the illegal channel numbers.

5. The method of claim 4 further comprising the steps of:

momentarily blanking a video presentation following the selection of said enter key; and momentarily muting a sound signal following the selection of said enter key while tuning to a selected legal channel.

6. In a television receiver tuning system controlled by a microcomputer wherein channel selection is by means of a keyboard including a plurality of selelctable digit keys for generating binary signals representing television channel numbers with said binary signals being transmitted to said microcomputer for display on a digital display, for storage in a first matrix memory in said microcomputer, and for controlling television receiver tuning circuitry, and a selectable enter key for tuning in a selected channel, a method of selecting a desired channel number by which the possibility of an erroneous channel number entry is reduced, said method comprising the steps of:

selecting a broadcast signal band by means of a selectable function switching means, said broadcast signal band including the desired channel;

selecting the desired channel number by actuating said selectable digit keys on said keyboard and displaying the selected channel number on said digital display;

storing said binary signals representing television channel numbers in first and second memory locations in said first matrix memory of the microcomputer, said first memory location providing the selected channel number to said digital display and said second memory location providing the selected channel number to said channel tuning circuitry;

actuating said enter key; and transmitting said selected channel number to tuning circuitry in said television receiver for tuning said television receiver to said selected channel number and retaining in said digital display the selected channel number if said enter key is selected within said predetermined period of time; or removing the selected channel number from memory storage in said microcomputer if the enter key is not selected within said predetermined period of time with the currently tuned channel number remaining in said secnd memory location, said microcomputer transmitting the contents of said second memory location to said first memory location thereby restoring the currently tuned channel number to said digital display.

7. In a television receiver tuning system controlled by a microcomputer wherein channel selection is by means of a keyboard including a plurality of selectable digit keys for generating binary signals representing television channel numbers with said binary signals being transmitted to said microcomputer for display on a digital display, for storage in a matrix memory in said microcomputer, and for controlling television receiver tuning circuitry, and a selectable enter key for tuning in a selected channel, a method of selecting a desired channel number by which the possibility of an erroneous channel number entry is reduced, said method comprising the steps of:

selecting a broadcast signal band by means of a selectable function switching means, said broadcast signal band including the desired channel;

selecting the desired channel number by actuating said selectable digit keys on said keyboard and displaying the selected channel number on said digital display;

storing said binary signals representing television channel numbers in first and second memory locations in said matrix memory of the microcomputer, said first memory location providing the selected channel number to said digital display and said second memory location providing the selected channel number to said channel tuning circuitry;
periodically scanning said keyboard by means of microcomputer-generated scanning signals for detecting contact key closure;
actuating said enter key; and
transmitting said selected channel number to tuning circuitry in said television receiver for tuning said television receiver to said selected channel number and retaining in said digital display the selected channel number if said enter key is selected within said predetermined period of time; or
removing the selected channel number from memory storage in said microcomputer if the enter key is not selected within said predetermined period of time with the currently tuned channel number remaining in said second memory location, said microcomputer transmitting the contents of said second memory location to said first memory location thereby restoring the currently tuned channel number to said digital display.

8. A channel selection system controlled by a microcomputer having first and second memory means for storing binary signals, for controlling tunable circuitry in a television receiver in tuning said television receiver from a currently tuned channel to a desired channel, said currently tuned channel and said desired being identified by respective channel numbers, said channel selection system comprising:
keyboard means for selecting the desired channel number and displaying said channel number on a digital display, said keyboard means including:
a plurality of selectable digit keys for generating binary signals corresponding to television channel numbers with said binary signals being transmitted to and stored in said first memory means of said microcomputer for providing said binary signals to said digital display following channel number entry on said keyboard; and
selectable function switching means for tuning to a broadcast signal band encompassing the desired channel;
counting means coupled to said microcomputer for measuring a predetermined time interval from the entry and storage of said binary signals in said first memory means;
selectable control means coupled to said first and second memory means for transferring said binary signals stored in said first memory means to said second memory means if said selectable control means is activated within said predetermined time interval as measured by said counting means, with the contents of said second memory means remaining unchanged if said selectable control means is not activated within said predetermined time interval; and
means for reading from said second memory means the contents thereof following said predetermined time interval and for providing the digital signals stored therein to said first memory means so as to permit said digital display to revert to the number of the currently tuned channel if said selectable control means is not activated within said predetermined time interval.

9. A channel selection system according to claim 8 further comprising:
video blanking means coupled to said microcomputer for temporarily blanking a video presentation following the selection of said control means during said predetermined time interval; and
audio muting means coupled to said microcomputer for temporarily muting a sound signal following the selection of said selectable control means during said predetermined time interval while tuning to said desired channel.

10. A channel selection system according to claim 8 wherein said predetermined time interval is 4.5 seconds.

11. A channel selection system controlled by a microcomputer having first, second and third memory means for storing binary signals, for controlling tunable circuitry in a television receiver in tuning said television receiver from a currently tuned channel to a desired channel, said currently tuned channel and said desired channel being identified by respective channel numbers, said channel selection system comprising:
keyboard means for selecting the desired channel number and displaying said channel number on a digital display, said keyboard means including:
a plurality of selectable digit keys for generating binary signals corresponding to television channel numbers with said binary signals being transmitted to and stored in said first memory means of said microcomputer for providing said binary signals to said digital display following channel number entry on said keyboard; and
selectable function switching means for tuning to a broadcast signal band encompassing the desired channel;
counting means coupled to said microcomputer for measuring a predetermined time interval from the entry and storage of said binary signals in said first memory means;
selectable control means coupled to said first and second memory means for transferring said binary signals stored in said first memory means to said second memory means if said selectable control means is activated within said predetermined time interval as measured by said counting means, with the contents of said second memory means remaining unchanged if said selectable control means is not activated within said predetermined time interval;
means for reading from said second memory means the contents thereof following said predetermined time interval and for providing the digital signals stored therein to said first memory means so as to permit said digital display to revert to the number of the currently tuned channel if said selectable control means is not activated within said predetermined time interval;
third memory means in said microcomputer for storing illegal channel numbers;
means for reading said illegal channel numbers from said third memory means and for comparing the selected channel number with said illegal channel numbers; and
logic means responsive to said reading and comparing means and coupled to said tunable circuitry and to said digital display for tuning said television receiver to and displaying the selected channel number if the selected channel number is not one of the illegal channel numbers, or for removing the selected channel number from said first memory means in said microcomputer while remaining tuned to the currently tuned channel with the digital display reverting to the currently tuned channel number if the selected channel number is an illegal channel number.

* * * * *

UNITED STATES PATENT OFFICE
CERTIFICATE OF CORRECTION

Patent No. 4,279,035  Dated July 14, 1981

Inventor(s) Peter C. Skerlos

It is certified that error appears in the above-identified patent and that said Letters Patent are hereby corrected as shown below:
In the specification, columns 15-26, TABLES I-V should be replaced in favor of TABLE 2 below:

KEYBOARD SCAN

| ADR | OBJ | STMT | | SOURCE | STATEMENT | | ERR.MSG |
|---|---|---|---|---|---|---|---|
| | | 420 | | TIT | | | |
| 0B4 | 51 | 421 | KY00 | LI | 1 | KEY BOARD SCAN | |
| 0B5 | F6 | 422 | | OTIE | 6 | | |
| 0B6 | 12 | 423 | | OTD | | | |
| | | 424 | * | | | | |
| 0B7 | 48 E4 | 425 | | CAL | MPD | VSYNC DETECTION | |
| | | 426 | * | | | | |
| | | 427 | * | LX | 0 | | |
| 0B9 | 60 | 428 | | LY | 0 | | |
| 0BA | 57 | 429 | | LI | 7 | 30 MACHINE CYCLE WAIT | |
| 0BB | 4A DC | 430 | | CAL | KEYDE2 | KEY 0 1 2 3 4 CHECK | |
| 0BD | 52 | 431 | | LI | 2 | | |
| 0BE | F5 | 432 | | OTIE | 5 | | |
| 0BF | 12 | 433 | | OTD | | | |
| 0C0 | 4A DB | 434 | | CAL | KEYDET | KEY 5 6 7 8 9 CHECK | |
| 0C2 | 54 | 435 | | LI | 4 | | |
| 0C3 | F3 | 436 | | OTIE | 3 | | |
| 0C4 | 12 | 437 | | OTD | | | |
| 0C5 | 4A DB | 438 | | CAL | KEYDET | KEY FTUP FTDN ENT CHECK | |
| 0C7 | 69 | 439 | | LY | 9 | KEY OFF | |
| 0C8 | 0D | 440 | | L | | BOUNCING COUNT | |
| 0C9 | 9E | 441 | | CI | 14 | | |
| 0CA | E3 CD | 442 | | BZ | KYY10 | | |
| 0CC | 51 | 443 | | LI | 1 | | |
| 0CD | 8F | 444 | KYY10 | AI | 15 | | |
| 0CE | 0A | 445 | KYY30 | ST | | | |
| 0CF | 41 E7 | 446 | KYY40 | JMP | TM00 | | |
| | | 447 | * | | | | |
| | | 448 | * | | | | |
| 0D1 | 02 | 449 | KY10 | TYA | | KEY ON | |
| 0D2 | 68 | 450 | | LY | 8 | KEY INPUT DATA STORE IN M(0,8) | |
| 0D3 | 0B | 451 | | STIC | | | |
| 0D4 | 0D | 452 | | L | | | |
| 0D5 | E2 DA | 453 | | BNZ | KYY20 | BOUNCING COUNT | |
| 0D7 | 81 | 454 | | AI | 1 | | |
| 0D8 | 40 CE | 455 | | JMP | KYY30 | | |
| 0DA | 91 | 456 | KYY20 | CI | 1 | | |
| 0DB | E2 CF | 457 | | BNZ | KYY40 | KEY DETECTED | |
| | | 458 | * | LI | 14 | | |
| | | 459 | * | ST | | | |
| 0DD | 41 C6 | 460 | | JMP | KDST | | |

UNITED STATES PATENT OFFICE
CERTIFICATE OF CORRECTION

Patent No. 4,279,035  Dated July 14, 1981

Inventor(s) Peter C. Skerlos

KEYBOARD SENSE

| ADR | OBJ | | STMT | | SOURCE STATEMENT | | ERR-MSG |
|---|---|---|---|---|---|---|---|
| | | | 1002 | | TIT | | |
| | | | 1003 | * | | | |
| | | | 1004 | * | | | |
| | | | 1005 | *KEYDET | CAL | WT100M | KEY BOARD SCAN----SUBROUTINE |
| | | | 1006 | *KEYDE2 | CAL | WT100M | |
| | | | 1007 | * | CAL | WT100M | |
| | | | 1008 | * | CAL | WT100M | 400MICROSEC COUNT |
| 2DB | 54 | | 1009 | KEYDET | LI | 4 | 40 MACHINE CYCLE WAIT |
| 2DC | 81 | | 1010 | KEYDE2 | AI | 1 | |
| 2DD | E2 | DC | 1011 | | BNZ | KEYDE2 | |
| 2DF | 14 | | 1012 | | INA | | |
| 2F0 | 9F | | 1013 | | CI | X'F' | NO KEY IN A PORT? |
| 2F1 | E3 | F1 | 1014 | | BZ | KT20 | |
| 2F3 | D1 | | 1015 | | TR | 1 | |
| 2F4 | E3 | EF | 1016 | | BZ | KT10 | KEY 0 5 |
| 2F6 | 2C | | 1017 | | ICY | | |
| 2F7 | D2 | | 1018 | | TR | 2 | |
| 2F8 | E3 | EF | 1019 | | BZ | KT10 | KEY 1 6 FTDN |
| 2FA | 2C | | 1020 | | ICY | | |
| 2FB | D4 | | 1021 | | TR | 4 | |
| 2FC | E3 | EF | 1022 | | BZ | KT10 | KEY 2 7 FTUP |
| 2FE | 2C | | 1023 | | ICY | | |
| | | | 1024 | * | TR | 8 | |
| | | | 1025 | * | BNZ | KT30 | KEY 3 8 |
| 2FF | 40 | D1 | 1026 | KT10 | JMP | KY10 | |
| 2F1 | 2C | | 1027 | KT20 | ICY | | |
| 2F2 | 2C | | 1028 | | ICY | | |
| 2F3 | 2C | | 1029 | | ICY | | |
| 2F4 | 2C | | 1030 | | ICY | | |
| 2F5 | 15 | | 1031 | | INB | | |
| 2F6 | D1 | | 1032 | | TR | 1 | |
| 2F7 | E3 | EF | 1033 | | BZ | KT10 | KEY 4 9 ENT |
| 2F9 | 50 | | 1034 | KT30 | LI | 0 | |
| 2FA | 12 | | 1035 | | OTD | | |
| 2FB | 2C | | 1036 | | ICY | | |
| 2FC | 1F | | 1037 | | RFT | | |

UNITED STATES PATENT OFFICE

CERTIFICATE OF CORRECTION

Patent No. 4,279,035  Dated July 14, 1981

Inventor(s) Peter C. Skerlos

AFC/CATV SWITCH SCAN

| ADR | OBJ | STMT | SOURCE STATEMENT | | ERR.MSG |
|---|---|---|---|---|---|
| | | 798 | | TIT | |
| | | 799 | * | | |
| | | 800 | * | | |
| | | 801 | * | | |
| | | 802 | * | | |
| | | 803 | * | | |
| | | 804 | * | | |
| 20A | 0D | 805 | ST10 | L | OPERATING STATE |
| 20B | D4 | 806 | | TR 4 | |
| 20C | C4 | 807 | | RM 4 | RESET STAND BY FLAG |
| 20D | E3 12 | 808 | | BZ ST15 | |
| 20F | C2 | 809 | | RM 2 | RESET CATV FLAG WHEN POWER ON |
| | | 810 | * | | TO AVOID ILLEGAL CATV CH SELECTION |
| 210 | 42 1F | 811 | | JMP STT30 | |
| 212 | 51 | 812 | ST15 | LI 1 | CATV SW CHECK |
| 213 | 12 | 813 | | OTD | |
| 214 | 0D | 814 | | L | |
| 215 | D2 | 815 | | TR 2 | |
| 216 | E2 23 | 816 | | BNZ STT10 | |
| 218 | 15 | 817 | | INB | CATV SW OFF(PREVIOUS STATE) |
| 219 | D8 | 818 | | TR 8 | |
| 21A | E3 27 | 819 | | BZ STT20 | |
| 21C | 52 | 820 | STT05 | LI 2 | CATV SW CHANGED |
| 21D | 06 | 821 | STT06 | XOR | CMPLEMENT CATV FLAG |
| 21E | 0A | 822 | | ST | |
| 21F | 49 4F | 823 | STT30 | CAL RDISP | |
| 221 | 41 0C | 824 | | JMP CR10 | |
| 223 | 15 | 825 | STT10 | INB | |
| 224 | D8 | 826 | | TR 8 | CATV SW ON( PREVIOUSSTATE) |
| 225 | E3 1C | 827 | | BZ STT05 | |
| 227 | 52 | 828 | STT20 | LI 2 | AFC SW CHECK |
| 228 | 12 | 829 | | OTD | |
| 229 | 0D | 830 | | L | |
| 22A | D1 | 831 | | TR 1 | |
| 22B | E2 34 | 832 | | BNZ STT40 | |
| 22D | 15 | 833 | | INB | AFC SW OFF (PREVIOUS STATE) |
| 22E | D8 | 834 | | TR 8 | |
| 22F | E3 38 | 835 | | BZ TM20 | |
| 231 | 51 | 836 | STT25 | LI 1 | AFC SW CHANGED |
| 232 | 42 1D | 837 | | JMP STT06 | |
| 234 | 15 | 838 | STT40 | INB | AFC SW ON(PREVIOUS STATE) |
| 235 | D8 | 839 | | TR 8 | |
| 236 | E3 31 | 840 | | BZ STT25 | |

UNITED STATES PATENT OFFICE
CERTIFICATE OF CORRECTION

Patent No. 4,279,035　　　　　　　　　Dated July 14, 1981

Inventor(s) Peter C. Skerlos

KEY ACCEPTED/DISPLAY DATA

| ADR | OBJ | STMT | | SOURCE STATEMENT | | ERR.MSG |
|---|---|---|---|---|---|---|
| | | 715 | | TIT | | |
| | | 716 | * | | | |
| | | 717 | * | | | |
| | | 718 | * | | | |
| | | 719 | * | | | |
| | | 720 | *KDCT | SM | X'E' | KEY IS DETECTED |
| 1C6 | 5E | 721 | KDCT | LI | 14 | |
| 1C7 | 0A | 722 | | ST | | |
| 1C8 | 68 | 723 | | LY | 8 | |
| 1C9 | 0D | 724 | | L | | KEY INPUT DATA |
| 1CA | 9A | 725 | | CI | X'A' | |
| 1CB | E5 0A | 726 | | BC | KD40 | |
| 1CD | 23 | 727 | | LD | 3 | NUMERIC KEY IS DEPRESSED |
| 1CE | E8 01 | 728 | | BNP | KD10 | |
| 1D0 | 50 | 729 | | LI | 0 | AFTER ENT. KEY |
| 1D1 | 26 | 730 | KD10 | STD | 2 | TENS DISPLAY DATA STORE |
| 1D2 | 29 | 731 | | RP | | |
| 1D3 | 0D | 732 | | L | | |
| 1D4 | 27 | 733 | | STD | 3 | UNITS DISPLAY DATA STORE |
| 1D5 | 31 | 734 | | LX | 1 | |
| 1D6 | 63 | 735 | | LY | 3 | |
| 1D7 | CF | 736 | | RM | X'F' | DISPLAY TIMER RESET |
| 1D8 | 41 E7 | 737 | KD20 | JMP | TM00 | |
| 1DA | 9E | 738 | KD40 | CI | X'E' | |
| 1DB | E3 0A | 739 | | BZ | CR00 | |
| 1DD | 9D | 740 | | CI | X'D' | |
| 1DE | E2 E5 | 741 | | BNZ | KD60 | MUTE KEY |
| 1E0 | 30 | 742 | | LX | 0 | |
| 1E1 | 66 | 743 | | LY | 6 | |
| 1E2 | 51 | 744 | | LI | 1 | |
| 1E3 | 06 | 745 | | XOR | | COMP MUTE FLAG |
| 1E4 | 0A | 746 | | ST | | |

UNITED STATES PATENT OFFICE
CERTIFICATE OF CORRECTION

Patent No. 4,279,035                    Dated July 14, 1981

Inventor(s) Peter C. Skerlos

ENTER KEY

| ADR | OBJ | STMT | SOURCE STATEMENT | | | ERR.MSG |
|-----|-----|------|------|------|------|---------|
|     |     | 516  |      | TIT  |      |         |
| 10A | E9 E7 | 517 | CR00 | BP | TM00 | ENT. KEY |
| 10C | 22  | 518  | CR10 | LD | 2    | NORMAL CHANNEL |
| 10D | E3 23 | 519 |     | BZ | CR50 |         |
| 10F | 20  | 520  |      | LD | 0    | CHANNEL NUMBER CHECK |
| 110 | D2  | 521  |      | TR | 2    |         |
| 111 | E2 29 | 522 |     | BNZ | CR60 |        |
| 113 | 22  | 523  |      | LD | 2    |         |
| 114 | 98  | 524  |      | CI | 8    |         |
| 115 | E5 19 | 525 |     | BC | CR30 |         |
| 117 | 40 09 | 526 | CR20 | JMP | NEWCH | VALID CHANNEL |
|     |     | 527  | *    |      |      | GO TO NEW CHANNEL SET ROUTINE |
|     |     | 528  | *    |      |      |         |
| 119 | E2 1F | 529 | CR30 | BNZ | CR40 |         |
| 11B | 23  | 530  |      | LD | 3    |         |
| 11C | 94  | 531  |      | CI | 4    |         |
| 11D | E4 17 | 532 |     | BNC | CR20 |         |
| 11F | 49 4F | 533 | CR40 | CAL | RDISP | INVALID CHANNEL |
| 121 | 41 E7 | 534 |     | JMP | TM00 | RECALL RECEIVING CHANNEL |
|     |     | 535  | *    |      |      |         |
| 123 | 23  | 536  | CR50 | LD | 3    |         |
| 124 | 92  | 537  |      | CI | 2    |         |
| 125 | E5 17 | 538 |     | BC | CR20 |         |
| 127 | 41 1F | 539 |     | JMP | CR40 |        |
|     |     | 540  | *    |      |      |         |
|     |     | 541  | *    |      |      |         |
| 129 | 22  | 542  | CR60 | LD | 2    | CATV SW ON |
| 12A | 93  | 543  |      | CI | 3    |         |
| 12B | E4 17 | 544 |     | BNC | CR20 |        |
| 12D | E2 1F | 545 |     | BNZ | CR40 |        |
| 12F | 23  | 546  |      | LD | 3    |         |
| 130 | 97  | 547  |      | CI | 7    |         |
| 131 | E5 1F | 548 |     | BC | CR40 | VALID CHANNEL--- CH-36 |
| 133 | 41 17 | 549 |     | JMP | CR20 |        |

UNITED STATES PATENT OFFICE

CERTIFICATE OF CORRECTION

Patent No. 4,279,035            Dated July 14, 1981

Inventor(s) Peter C. Skerlos

VALID CHANNEL

| ADR | OBJ | STMT | | SOURCE STATEMENT | | ERR,MSG |
|---|---|---|---|---|---|---|
| | | 219 | | TIT | | |
| | | 220 | • | INA | | POWER ON |
| | | 221 | • | BNZ | IN00 | IF A10-A13 LO, GO TO TEST ROUTINE |
| | | 222 | • | JMP | TEST | |
| | | 223 | • | | | |
| | | 224 | • | | | |
| 000 | 50 | 225 | IN00 | LI | 0 | POWER ON INITIALIZATION |
| 001 | 24 | 226 | | STD | 0 | NORMAL BAND |
| 002 | 25 | 227 | | STD | 1 | LVHF BAND |
| 003 | 26 | 228 | | STD | 2 | |
| 004 | 52 | 229 | | LI | 2 | |
| 005 | 27 | 230 | | STD | 3 | CHANNEL 2 |
| | | 231 | • | SP | | |
| 006 | 30 | 232 | | LX | 0 | |
| 007 | 66 | 233 | | LY | 6 | |
| 008 | CF | 234 | | RM | 15 | CLEAR MUTE FLAG |

RECALL CHANNEL DISPLAY

| ADR | OBJ | STMT | | SOURCE STATEMENT | | ERR,MSG |
|---|---|---|---|---|---|---|
| | | 582 | | TIT | | |
| | | 583 | • | | | |
| 14F | 30 | 584 | RDISP | LX | 0 | CHANNEL RECALL DISPLAY |
| 150 | 64 | 585 | | LY | 4 | TRANSFER CHANNEL DATA TO DISPLAY |
| 151 | 0E | 586 | | LIC | | |
| 152 | 26 | 587 | | STD | 2 | |
| 153 | 0D | 588 | | L | | |
| 154 | 27 | 589 | | STD | 3 | |
| 155 | 41 3E | 590 | | JMP | LS10 | |

Signed and Sealed this

Eleventh Day of May 1982

[SEAL]

Attest:

GERALD J. MOSSINGHOFF

*Attesting Officer*      *Commissioner of Patents and Trademarks*